(12) United States Patent
Hayashi et al.

(10) Patent No.: US 8,168,352 B2
(45) Date of Patent: May 1, 2012

(54) REFLECTIVE MASK BLANK FOR EUV LITHOGRAPHY AND MASK FOR EUV LITHOGRAPHY

(75) Inventors: Kazuyuki Hayashi, Tokyo (JP); Toshiyuki Uno, Tokyo (JP); Ken Ebihara, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/004,081

(22) Filed: Jan. 11, 2011

(65) Prior Publication Data
US 2011/0104595 A1    May 5, 2011

Related U.S. Application Data

(63) Continuation of application No. PCT/JP2009/062631, filed on Jul. 10, 2009.

(30) Foreign Application Priority Data

Jul. 14, 2008 (JP) .................................. 2008-182439

(51) Int. Cl.
*G03F 1/00* (2012.01)
(52) U.S. Cl. .......................................................... 430/5
(58) Field of Classification Search .............. 430/5, 322; 378/35; 382/144
See application file for complete search history.

(56) References Cited

U.S. PATENT DOCUMENTS

| 7,390,596 B2 * | 6/2008 | Ishibashi et al. ................. 430/5 |
| 7,713,666 B2 | 5/2010 | Hayashi et al. |
| 7,718,324 B2 | 5/2010 | Hayashi et al. |
| 7,855,036 B2 | 12/2010 | Hayashi et al. |
| 2005/0227152 A1 * | 10/2005 | Yan et al. ......................... 430/5 |
| 2006/0251973 A1 | 11/2006 | Takaki et al. |
| 2009/0011341 A1 | 1/2009 | Hayashi et al. |
| 2009/0148781 A1 | 6/2009 | Kamo et al. |
| 2009/0220869 A1 | 9/2009 | Takai |

(Continued)

FOREIGN PATENT DOCUMENTS

JP    2002-217097    8/2002

(Continued)

OTHER PUBLICATIONS

U.S. Appl. No. 13/070,728, filed Mar. 24, 2011, Hayashi.

(Continued)

*Primary Examiner* — Stephen Rosasco
(74) *Attorney, Agent, or Firm* — Oblon, Spivak, McClelland, Maier & Neustadt, L.L.P.

(57) ABSTRACT

Provision of an EUV mask whereby an influence of reflected light from a region outside a mask pattern region is suppressed, and an EUV mask blank to be employed for production of such an EUV mask.

A reflective mask for EUV lithography (EUVL), comprising a substrate having a mask pattern region and an EUV light-absorbing region located outside the mask pattern region; a reflective layer provided on the mask pattern region of the substrate for reflecting EUV light and having a portion on which an absorber layer is present and a portion on which no absorber layer is present; the portion on which an absorber layer is present and the portion on which no absorber layer is present being arranged so as to constitute a mask pattern; wherein the reflectivity of a surface of the absorber layer for EUV light is from 5 to 15% and the reflectivity of a surface of the EUV light-absorbing region for EUV light is at most 1%.

44 Claims, 4 Drawing Sheets

U.S. PATENT DOCUMENTS

2010/0035165 A1 2/2010 Hayashi et al.
2010/0304283 A1 12/2010 Hayashi et al.

FOREIGN PATENT DOCUMENTS

| | | |
|---|---|---|
| JP | 2003-338461 | 11/2003 |
| JP | 2004-207593 | 7/2004 |
| JP | 2006-228766 | 8/2006 |
| JP | 2007-273514 | 10/2007 |
| JP | 2007-335908 | 12/2007 |
| JP | 2004-6798 | 1/2008 |
| JP | 2009-141223 | 6/2009 |
| JP | 2009-212220 | 9/2009 |
| WO | 2006/105460 | 10/2006 |

OTHER PUBLICATIONS

U.S. Appl. No. 13/093,968, filed Apr. 26, 2011, Hayashi.
U.S. Appl. No. 12/952,254, filed Nov. 23, 2010, Hayashi.
International Search Report issued Oct. 13, 2009, PCT/JP09/062631 filed Jul. 10, 2009.

* cited by examiner

REFLECTIVE MASK BLANK FOR EUV LITHOGRAPHY AND MASK FOR EUV LITHOGRAPHY

TECHNICAL FIELD

The present invention relates to a reflective mask blank for EUV (Extreme Ultra Violet) lithography (in this specification, hereinafter referred to as "EUV mask blank") to be used for e.g. production of semiconductors, and a reflective mask (in this specification, hereinafter referred to as "EUV mask") obtained by forming a mask pattern in an absorber layer of such an EUV mask blank.

BACKGROUND ART

In the semiconductor industry, a photolithography method using visible light or ultraviolet light has been employed as a technique for writing, on a Si substrate or the like, a fine pattern, which is required for forming an integrated circuit comprising such a fine pattern. However, the conventional photolithography method has been close to the resolution limit, while microsizing of semiconductor devices has been accelerated. In the case of the photolithography method, it is said that the resolution limit of a pattern is about ½ of an exposure wavelength, and that even if an immersion method is employed, the resolution limit is about ¼ of an exposure wavelength. Even if an immersion method using an ArF laser (193 nm) is employed, it is estimated that the resolution limit is about 45 nm. From this point of view, EUV lithography, which is an exposure technique using EUV light having a shorter wavelength than ArF lasers, is considered to be promising as an exposure technique for 45 nm or below. In this specification, "EUV light" means a ray having a wavelength in a soft X-ray region or a vacuum ultraviolet ray region, specifically a ray having a wavelength of from about 10 to 20 nm, in particular, of about 13.5 nm±0.3 nm.

EUV light is apt to be absorbed by any substances and the refractive indices of substances are close to 1 at this wavelength, whereby it is impossible to use a dioptric system like a conventional photolithography employing visible light or ultraviolet light. For this reason, for EUV light lithography, a catoptric system, i.e. a combination of a reflective photomask (EUV mask) and a mirror, is employed.

A mask blank is a laminate for a photomask, which has not been patterned yet. In the case of an EUV mask blank, it has a structure wherein a reflective layer for reflecting EUV light and an absorber layer for absorbing EUV light, are deposited in this order on a substrate made of glass or the like (Patent Document 1). Besides these layers, in such an EUV mask blank, a protection layer for protecting the reflective layer at a time of forming a mask pattern in the absorber layer, is usually deposited between the reflective layer and the absorber layer. Further, on the absorber layer, a low reflective layer is usually deposited for improving the contrast at a time of inspecting a mask pattern.

In such an EUV mask blank, the thickness of the absorber layer is preferably thin. In EUV lithography, exposure light is not incident from a perpendicular direction to an EUV mask but incident from a direction at an angle of a few degrees, usually 6 degrees, to the perpendicular direction. If the thickness of the absorber layer is thick, at a time of EUV lithography, a shadow of the exposure light is formed on a mask pattern formed by removing a part of the absorber layer by etching, and the pattern accuracy or the dimension accuracy of a mask pattern (hereinafter referred to as "transfer pattern") transferred to a resist on a substrate such as a Si wafer by using the EUV mask, tends to be deteriorated. Since this problem becomes more significant as the line width of the mask pattern formed on the EUV mask becomes smaller, the thickness of the absorber layer of the EUV mask blank is preferably thinner.

For the absorber layer of the EUV mask blank, a material having a high absorption coefficient for EUV light is employed, and the thickness is ideally a thickness whereby EUV light incident into a surface of the absorber layer is completely absorbed. However, as described above, since the thickness of the absorber layer is required to be thin, it is not possible for the absorber layer to completely absorb EUV light incident into the layer, and a part of the light becomes reflected light.

In the step of forming a transfer pattern of a resist on a substrate by EUV lithography, an important characteristic is the contrast of reflected light from the EUV mask, that is, the contrast between reflected light from a portion of the mask wherein the absorber layer is removed at a time of forming the mask pattern so that the reflective layer is exposed to the outside, and reflected light from a portion of the mask wherein the absorber layer is not removed at the time of forming the mask pattern. Accordingly, it has been considered that so long as a sufficient contrast of reflected light is obtained, there is no problem even if the incident EUV light is not completely absorbed by the absorber layer.

Based on the above concept, in order to reduce the thickness of the absorber layer, an EUV mask using the principle of phase shift is proposed (refer to Patent Document 2). This has a characteristics that a portion from which the absorber layer is not removed at a time of forming a mask pattern has a reflectivity of from 5 to 15%, and that reflected light from such a portion has a phase difference of 175 to 185° from reflected light from a portion where the absorber layer is removed at the time of forming the mask pattern so that the reflective layer is exposed to the outside. The document describes that with the EUV mask, by using the principle of phase shift for reflected light from the absorber layer, it is possible to maintain a sufficient contrast to the reflective layer, and accordingly, it is possible to reduce the thickness of the absorber layer.

PRIOR ART

Patent Documents

Patent Document 1: JP-A-2004-6798 (U.S. Pat. No. 7,390,596)

Patent Document 2: JP-A-2006-228766

DISCLOSURE OF THE INVENTION

Problems to be Solved by the Invention

However, the present inventors have discovered that the above principle and the layer constructions have no problem for a real mask pattern region (a region wherein a mask pattern is formed, which is used for pattern-transferring at a time of EUVL), but the structures have a problem for peripheral portions of the pattern area. This point will be described with reference to FIG. 9. FIG. 9 is a schematic cross-sectional view showing an example of EUV mask after a pattern is formed, wherein a reflective layer 130 and an absorber layer 140 are deposited in this order on a substrate 120, and in a mask pattern region 210, a mask pattern formed by partially removing the absorber layer 140, is present. In the mask pattern region 210 of an EUV mask 100, by the above principle of phase shift, a sufficient reflection contrast between a surface of the reflective layer 130 and a surface of the absorber layer 140 can be maintained. However, the region in which EUV light is really radiated, is a real exposure region 200. Accordingly, EUV light is incident into also a region 220 outside the mask pattern region 210. At this time, since the effect of phase shift with reflected light from the reflective layer 130 is not sufficiently obtained, reflection of from about 5 to 15% from a surface of the absorber layer 140 occurs. As a result, this about 5 to 15% of EUV light is incident into a resist on a Si substrate, and there may occur a problem of unnecessary exposure of resist. Particularly, at a time of carrying out an overlay exposure, this problem becomes significant.

In order to solve the above problems of conventional technique, it is an object of the present invention to provide an EUV mask whereby an influence of reflected light from a region outside a mask pattern region is suppressed, and an EUV mask blank to be used for producing such an EUV mask.

Means to Solve the Problems

In order to solve the above problem, the present invention has the following gists.

(1) A reflective mask for EUV lithography (EUVL), comprising: a substrate having a mask pattern region of the substrate and an EUV light-absorbing region located outside the mask pattern region of the substrate, the reflectivity of a surface of the EUV light-absorbing region for EUV light being at most 1%; and a reflective layer for reflecting EUV light provided on the mask pattern region of the substrate; the reflective mask having a portion in which an absorber layer is present on the reflective layer and a portion in which no absorber layer is present on the reflective layer, the reflectivity of a surface of the absorber layer for EUV light being from 5 to 15%; wherein the portion in which the absorber layer is present and the portion in which no absorber layer is present are arranged so as to form a mask pattern. (Hereinafter the mask of (1) is referred to as "EUV mask (A-1) of the present invention".)

(2) The reflective mask for EUVL according to the above (1), which further comprises a reflective layer for reflecting EUV light, a first absorber layer for absorbing EUV light and a second absorber layer for absorbing EUV light present in this order on the EUV light-absorbing region of the substrate, wherein the thickness of the absorber layer present on the mask pattern region is from 10 to 60 nm, the total thickness of the first and second absorber layers present on the EUV light-absorbing region is from 70 to 120 nm. (Hereinafter the mask of (2) is referred to as "EUV mask (A-2) of the present invention".)

(3) The reflective mask for EUVL according to the above (1), which further comprises a reflective layer for reflecting EUV light and an absorber layer for absorbing EUV light present in this order on the EUV light-absorbing region of the substrate, wherein the thickness of the absorber layer present on the mask pattern region is from 10 to 60 nm, and the thickness of the absorber layer present on the EUV light-absorbing region is from 70 to 120 nm. (Hereinafter the mask of (3) is referred to as "EUV mask (A-3) of the present invention".)

(4) The reflective mask for EUVL according to the above (2), wherein the absorber layer and the first absorber layer each contains tantalum (Ta) as the main component and contains at least one component selected from the group consisting of hafnium (Hf), zirconium (Zr), germanium (Ge), silicon (Si), boron (B), nitrogen (N) and hydrogen (H); and the second absorber layer contains at least one component selected from the group consisting of tantalum (Ta), hafnium (Hf), germanium (Ge), silicon (Si), boron (B), titanium (Ti), chromium (Cr), platinum (Pt), gold (Au) and palladium (Pd).

(5) The reflective mask for EUVL according to the above (3), wherein the absorber layer contains tantalum (Ta) as the main component and contains at least one component selected from the group consisting of hafnium (Hf), zirconium (Zr), germanium (Ge), silicon (Si), boron (B), nitrogen (N) and hydrogen (H).

(6) The reflective mask for EUVL according to any one of the above (1) to (5), wherein the absorber layer is a layer whereby the phase of EUV reflected light from a surface of the absorber layer is different from the phase of EUV reflected light from the reflective layer by from 175 to 185°.

(7) A reflective mask for EUVL, comprising: a substrate having a mask pattern region of the substrate and an EUV light-absorbing region located outside the mask pattern region of the substrate, the reflectivity of a surface of the EUV light-absorbing region for EUV light being at most 1%; and a reflective layer for reflecting EUV light provided on the mask pattern region of the substrate; the reflective mask having a portion in which an absorber layer for absorbing EUV light and a low reflective layer for improving the contrast of inspecting the mask pattern are present in this order on the reflective layer, and a portion in which no absorber layer and no low reflective layer are present on the reflective layer, the reflectivity of a surface of the low reflective layer for EUV light being from 5 to 15%; wherein the portion in which the absorber layer and the low reflective layer are present and the portion in which no absorber layer and no low reflective layer are present are arranged so as to form a mask pattern. (Hereinafter the mask of (7) is referred to as "EUV mask (B-1) of the present invention".)

(8) The reflective mask for EUVL according to the above (7), which further comprises a reflective layer for reflecting EUV light, a first absorber layer for absorbing EUV light, a low reflective layer for improving the contrast at a time of inspecting the mask pattern and a second absorber layer for absorbing EUV light present in this order on the EUV light-absorbing region of the substrate, wherein the total thickness of the absorber layer and the low reflective layer present on the mask pattern region is from 10 to 65 nm, and the total thickness of the first and second absorber layers and the low reflective layer present in the EUV light-absorbing region is from 12 to 100 nm.

(9) The reflective mask for EUVL according to the above (8), wherein the first absorber layer, the low reflective layer and the second absorber layer each contains tantalum (Ta) as the main component and contains nitrogen (N).

(10) The reflective mask for EUVL according to the above (9), wherein the content of oxygen in each of the first absorber layer and the second absorber layer is at most 15 at %.

(11) The reflective mask for EUVL according to any one of the above (7) to (10), wherein the low reflective layer is a layer whereby the phase of EUV reflected light from a surface of the low reflective layer is different from the phase of EUV reflected light from the reflective layer by from 175 to 185°.

(12) A reflective mask blank for EUV lithography (EUVL) comprising a substrate, and a reflective layer for reflecting EUV light, a first absorber layer for absorbing EUV light and a second absorber layer for absorbing EUV light present in this order on the substrate, wherein the reflectivity of a surface of the absorber layer for EUV light is from 5 to 15%, and the reflectivity of a surface of the second absorber layer for EUV light is at most 1%. (Hereinafter the mask blank of (12) is referred to as "EUV mask blank (A) of the present invention".)

(13) The reflective mask blank for EUVL according to the above (12), wherein the ratio of the etching rate of the first absorber layer to the etching rate of the second absorber layer (etching selectivity) is less than 0.1.

(14) The reflective mask blank for EUVL according to the above (12) or (13), wherein the first absorber layer is a layer whereby the phase of EUV reflected light from the surface of the first absorber layer is different from the phase of EUV reflected light from the reflective layer by from 175 to 185°.

(15) A reflective mask blank for EUV lithography (EUVL) comprising a substrate, and a reflective layer for reflecting EUV light, a first absorber layer for absorbing EUV light, a low reflective layer for improving the contrast at a time of inspecting the mask pattern, and a second absorber layer for absorbing EUV light present in this order on the substrate; wherein the reflectivity of a surface of the low reflective layer for EUV light is from 5 to 15%, and the reflectivity of a surface of the second absorber layer for EUV light is at most 1%. (Hereinafter the mask blank of (15) is referred to as "EUV mask blank (B) of the present invention".)

(16) The reflective mask blank for EUVL according to the above (15), wherein the ratio of the etching rate of the low reflective layer to the etching rate of the second absorber layer (etching selectivity) is less than 0.1.

(17) The reflective mask blank for EUVL according to the above (15) or (16), wherein the low reflective layer is a layer whereby the phase of EUV reflected light from a surface of the low reflective layer is different from the phase of EUV reflected light from the reflective layer by from 175 to 185°.

(18) The reflective mask blank for EUVL according to any one of the above (15) to (17), wherein the first absorber layer, the low reflective layer and the second absorber layer each contains tantalum (Ta) as the main component and contains at least one component selected from the group consisting of hafnium (Hf), zirconium (Zr), germanium (Ge), silicon (Si), boron (B), nitrogen (N) and hydrogen (H).

(19) The reflective mask blank for EUVL according to any one of the above (15) to (18), wherein the low reflective layer contains tantalum (Ta) as the main component and contains at least one component selected from the group consisting of hafnium (Hf), germanium (Ge), silicon (Si), boron (B), nitrogen (N), hydrogen (H) and oxygen (O).

(20) The reflective mask blank for EUVL according to any one of the above (15) to (19), wherein the thickness of the low reflective layer is from 1 to 20 nm.

(21) A reflective mask blank for EUV lithography (EUVL) comprising a substrate, and a reflective layer for reflecting EUV light and a first absorber layer for absorbing EUV light laminated in this order on the substrate; which further comprises a second absorber layer for absorbing EUV light that is provided on the first absorber layer present outside a portion to be used as a mask pattern region in a reflective mask for EUV lithography (EUVL) to be produced by the reflective mask blank for EUVL; wherein the reflectivity of a surface of the first absorber layer for EUV light is from 5 to 15%, and the reflectivity of a surface of the second absorber layer for EUV light is at most 1%. (Hereinafter the mask blank of (21) is referred to as "EUV mask blank (C) of the present invention".)

(22) The reflective mask blank for EUVL according to the above (21), wherein the first absorber layer is a layer whereby the phase of EUV reflected light from a surface of the first absorber layer is different from the phase of EUV reflected light from the reflective layer by from 175 to 185°.

(23) The reflective mask blank for EUVL according to the above (21), which further comprises a low reflective layer present on the first absorber layer, for improving the contrast at a time of inspecting the mask pattern.

(24) The reflective mask blank for EUVL according to the above (23), wherein the low reflective layer is a layer whereby the phase of EUV reflected light from a surface of the low reflective layer is different from the phase of EUV reflected light from the reflective layer by from 175 to 185°.

(25) The reflective mask blank for EUVL according to any one of the above (21) to (24), wherein the first absorber layer contains tantalum (Ta) as the main component and contains at least one component selected from the group consisting of hafnium (Hf), zirconium (Zr), germanium (Ge), silicon (Si), boron (B), nitrogen (N) and hydrogen (H); and the second absorber layer contains at least one component selected from the group consisting of tantalum (Ta), hafnium (Hf), germanium (Ge), silicon (Si), boron (B), titanium (Ti), chromium (Cr), platinum (Pt), gold (Au) and palladium (Pd).

(26) The reflective mask blank for EUVL according to any one of the above (23) to (25), wherein the low reflective layer contains tantalum (Ta) as the main component and contains at least one component selected from the group consisting of hafnium (Hf), germanium (Ge), silicon (Si), boron (B), nitrogen (N), hydrogen (H) and oxygen (O).

(27) The reflective mask blank for EUVL according to any one of the above (23) to (26), wherein the thickness of the low reflective layer is from 1 to 20 nm.

(28) The reflective mask blank for EUVL according to any one of the above (12) to (27), wherein the thickness of the first absorber layer is from 10 to 60 nm.

(29) The reflective mask blank for EUVL according to any one of the above (12) to (28), wherein the thickness of the second absorber layer is from 10 to 60 nm.

(30) The reflective mask blank for EUVL according to any one of the above (12) to (29), which further comprises a protection layer between the reflective layer and the first absorber layer, for protecting the reflective layer at a time of forming a mask pattern.

(31) A process for producing a reflective mask for EUVL by employing the reflective mask blank for EUVL as defined in any one of the above (12) to (14); the process comprising removing the second absorber layer present in a portion to be a mask pattern region in a reflective mask for EUVL to be produced, to expose the first absorber layer to the outside, and forming a mask pattern in the first absorber layer exposed to the outside in the above step. (Hereinafter the process of (31) is referred to as "process (1) for producing EUV mask of the present invention".)

(32) A process for producing a reflective mask for EUVL by employing the reflective mask blank for EUVL as defined in any one of the above (15) to (20); the process comprising removing the second absorber layer present in a portion to be a mask pattern region in a reflective mask for EUVL to be produced, to expose the low reflective layer to the outside, and forming a mask pattern through both the low reflective layer exposed to the outside by the above step and the first absorber layer present under the low reflective layer. (Hereinafter the process of (32) is referred to as "process (2) for producing EUV mask of the present invention".)

(33) A process for producing a semiconductor integrated circuit, which comprises carrying out an exposure of an object to be exposed by using the reflective mask for EUVL as defined in any one of the above (1) to (11), to produce a semiconductor integrated circuit.

(34) A process for producing a semiconductor integrated circuit, which comprises carrying out an exposure of an object to be exposed by using the reflective mask for EUVL produced by the process as defined in the above (31) or (32), to produce a semiconductor integrated circuit.

EFFECTS OF THE INVENTION

In the EUV mask of the present invention, by providing an EUV light-absorbing region outside a mask pattern region, it is possible to reduce reflected light from a region outside the mask pattern region. Accordingly, it is possible to avoid unnecessary exposure of a resist on a substrate due to reflected light from a region outside the mask pattern region.

In the mask pattern region, by using the principle of the phase shift, it is possible to reduce the thickness of the absorber layer. Accordingly, it is possible to miniaturize a pattern, and a transfer pattern formed of a resist on a substrate by using such an EUV mask, is excellent in the pattern accuracy or dimension accuracy.

The EUV mask of the present invention can be obtained from the EUV mask blank of the present invention by using the process for producing an EUV mask of the present invention.

BEST MODE FOR CARRYING OUT THE INVENTION

Now, the EUV mask blank and EUV mask of the present invention will be described with reference to drawings.

Figure 1:
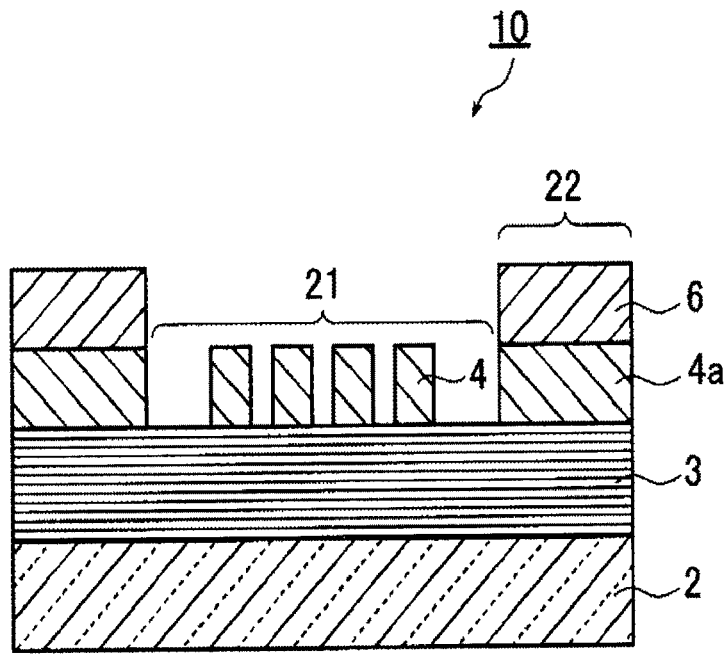
FIG. 1 is a schematic cross-sectional view showing an embodiment of EUV mask (A-2) of the present invention.

FIG. 1 is a schematic cross-sectional view showing an example of an EUV mask (A-2) that is an embodiment of the EUV mask (A-1) of the present invention. An EUV mask 10 shown in FIG. 10 has a mask pattern region 21 and an EUV light-absorbing region 22 located outside the mask pattern region 21 on a substrate 2.

The mask pattern region 21 is a region having a mask pattern and to be used for transferring the pattern at a time of EUVL. The EUV mask (A-2) has a reflective layer 3 for reflecting EUV light in the mask pattern region 21 on a substrate 2, and on the reflective layer 3, a portion having an absorber layer 24 absorbing EUV light and a portion having no absorber layer 4 are present.

The portion having the absorber layer 4 and the portion having no absorber layer 4 are arranged so as to form a desired mask pattern.

Meanwhile, the EUV mask (A-2) has a reflective layer 3 for reflecting EUV light, a first absorber layer 4 for absorbing EUV light and a second absorber layer 6 for absorbing EUV light in this order in the EUV light-absorbing region 22 on the substrate 2. Here, the first absorber layer 4a in the EUV light-absorbing region 22 is named as a first absorber layer for convenience of distinguishing it from the second absorber layer, but the first absorber layer 4a in the EUV light-absorbing region forms the same layer as the absorber layer 4 in the mask pattern region 21 in a stage of EUV mask blank before forming a mask pattern. In short, the EUV mask (A-2) of the present invention has, in its EUV light-absorbing region 22, a second absorber layer 6 in addition to the construction of the absorber layer 4 and below (substrate 2, reflective layer 3 and absorber layer 4) in the mask pattern region 21.

By constructing such a construction, in the EUV mask (A-2) of the present invention, the reflectivity of the second absorber layer 6 in the EUV light-absorbing region 22 becomes extremely low as compared with the reflectivity of a surface of the absorber layer 4 present in the mask pattern region 21. Specifically, while the reflectivity for EUV light of a surface of the absorber layer 4 present in the mask pattern region 21 is from 5 to 15%, the reflectivity for EUV light of a surface of the EUV light-absorbing region 22, more specifically, a surface of the second absorber layer 6, becomes at most 1%. Here, "EUV reflected light" means reflected light caused at a time of making a light beam in the wavelength region of EUV light incident at an incident angle of 6°, and "reflectivity for EUV light" means reflectivity for a light beam having a wavelength in the vicinity of 13.5 nm in EUV light.

EUV reflected light from a surface of the second absorber layer 6 is preferably at most 0.8%, particularly preferably at most 0.6%.

As described above, the thickness of the absorber layer is preferably thin, and at a time of radiating EUV light into an EUV mask, a certain degree of reflected light is caused from a surface of the absorber layer. In the case of EUV mask of the present invention, the reflectivity of EUV reflected light from a surface of the absorber layer is from 5 to 15%. Even if the reflectivity of EUV reflected light from a surface of the absorber layer is from 5 to 15%, in the mask pattern region of EUV mask, it is possible to maintain a sufficient reflective contrast between a surface of the reflective layer and a surface of the absorber layer by using the principle of phase shift. However, in a portion outside the mask pattern region, the effect of phase shift with reflected light from the reflective layer cannot be sufficiently obtained, and there may occur a problem that a resist on a Si substrate is exposed due to EUV reflected light from a surface of the absorber layer in a portion outside the mask pattern region.

In the EUV mask (A-2) of the present invention, by providing an EUV light-absorbing region 22 outside the mask pattern region 21, it is possible to reduce EUV reflected light from a portion outside the mask pattern region 21 while reducing the thickness of the absorber layer 4 in the mask pattern region 21, thereby to avoid the above problem due to EUV reflected light from a portion outside the mask pattern region at a time of EUV lithography.

Here, the EUV mask (A-1) of the present invention, that is a super ordinate concept of the EUV mask (A-2) of the present invention, may have a construction different from that of the EUV mask 10 shown in FIG. 1 so long as it is possible to reduce EUV reflected light from a portion outside the mask pattern region while reducing the thickness of the absorber layer of the mask pattern region.

Figure 2:
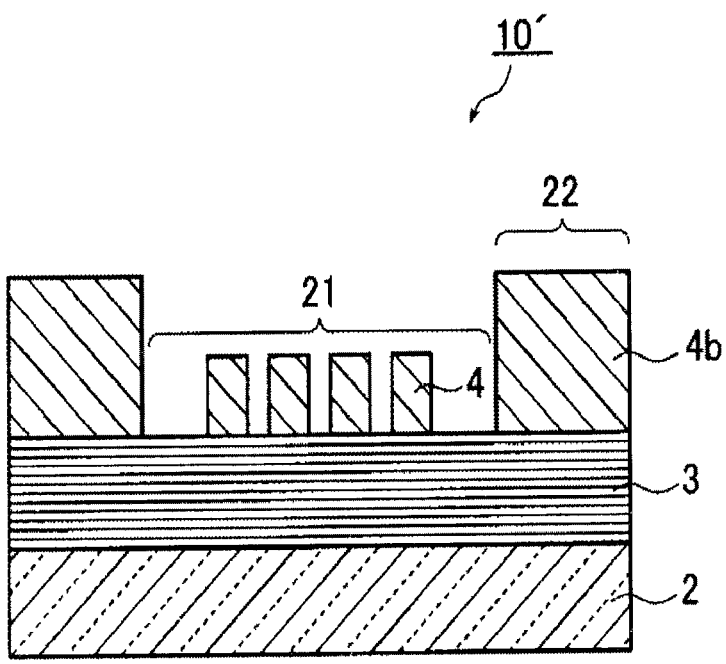
FIG. 2 is a schematic cross-sectional view showing an embodiment of EUV mask (A-3) of the present invention.

FIG. 2 is a schematic cross-sectional view showing an example of an EUV mask (A-3) being an embodiment of the EUV mask (A-1) of the present invention. In an EUV mask

10' shown in FIG. 2, differently from the EUV mask 10 shown in FIG. 1 wherein the absorber layer in the EUV light-absorbing region 22 has a two-layer structure (first absorber layer 4a, second absorber layer 6), an absorber layer in an EUV light-absorbing region 22 is a single absorber layer 4b. Here, the thickness of the absorber layer is different between the mask pattern region 21 and the EUV light-absorbing region 22, and the absorber layer 4b in the EUV light-absorbing region 22 is thicker than the absorber layer 4 in the mask pattern region 21. The absorption characteristic of EUV light in the absorber layer depends on the thickness of the absorber layer, and accordingly, so long as the reflectivity of a surface of the absorber layer 4 present in the mask pattern region 21 for EUV light is from 5 to 15% and the reflectivity of a surface of the absorber layer 4b in the EUV light-absorbing region 22 for EUV light is at most 1%, the EUV mask of the present invention may have a construction shown in FIG. 2. The reflectivity of a surface of the absorber layer 4b of the EUV light-absorbing region 22 for EUV light is preferably at most 0.8%, particularly preferably at most 0.6%.

Now, constituents of the EUV mask (A-1) will be described. Here, for convenience of explanation, as reference numerals showing constituents of the EUV mask, ones used for the EUV mask 10 shown in FIG. 1 are used. Here, the following descriptions of substrate 2, reflective layer 3 and protection layer are applicable in the same manner to other embodiments besides (A-1).

A substrate 2 is required to satisfy characteristics as a substrate for EUV mask.

Accordingly, the substrate 2 preferably has a low thermal expansion coefficient (specifically, the thermal expansion coefficient at 20° C. is preferably $0\pm0.05\times10^{-7}/°$ C., particularly preferably $0\pm0.03\times10^{-7}/°$ C.), and is preferably excellent in the smoothness, the flatness and the durability against a cleaning fluid to be used for cleaning of the EUV mask or an EUV mask blank before forming a mask pattern in the absorber layer. As the substrate 2, specifically, a glass having a low thermal expansion coefficient, such as a $SiO_2$—$TiO_2$ type glass is employed, but the substrate 2 is not limited thereto, and a substrate of crystallized glass produced by separating a β quartz solid solution, a quartz glass, silicon or a metal may also be employed.

The substrate 2 preferably has a smooth surface having a surface roughness (rms) of at most 0.15 nm according to JIS-B0601 and a flatness of at most 100 nm, for the purpose of obtaining a high reflectivity and a high transfer accuracy in an EUV mask.

The size or the thickness, etc. of the substrate 2 is appropriately determined depending on the design values of EUV mask, and for example, the external size is about 6 inch (152 mm) square and the thickness is about 0.25 inch (6.3 mm).

It is preferred that no defect is present on a film-deposition plane of the substrate 2 (a plane on which the reflective layer is to be deposited). However, even if the defects are present, in order to avoid formation of phase defects due to concave defects and/or convex defects, the depth of such concave defects and the height of such convex defects are preferably at most 2 nm, and the full width half maximum of such concave defects and convex defects is preferably at most 60 nm.

The reflective layer 3 is not particularly limited so long as it has a desired characteristics of a reflective layer of EUV mask. Here, the characteristics particularly required for the reflective layer 3 is high EUV light reflectivity. Specifically, the maximum value of the reflectivity of the reflective layer for EUV light is preferably at least 60%, more preferably at least 65%. Further, even in a case of providing a protection layer or a low reflective layer on the reflective layer 3, the maximum value of the reflectivity for EUV light is preferably at least 60%, more preferably at least 65%.

As the reflective layer 3, a multilayer reflective film being a lamination of alternately laminated a plurality of high refractive index layers and low refractive index layers is usually employed for the purpose of achieving high EUV light reflectivity. In a multilayer reflective film-deposition the reflective layer 3, Mo is widely used for the high refractive index layers, and Si is widely used for the low refractive index layers. Namely, a Mo/Si multilayer reflective film is the most common. However, the multilayer reflective film is not limited thereto, and a Ru/Si multilayer reflective film, a Mo/Be multilayer reflective film, a Mo compound/Si compound multilayer reflective film, a Si/Mo/Ru multilayer reflective film, a Si/Mo/Ru/Mo multilayer reflective film or a Si/Ru/Mo/Ru multilayer reflective film may also be employed.

The film thickness of each layer and the number of repeating units of the layers constituting the multilayer reflective film-deposition the reflective layer 3, can be appropriately selected according to the film material to be used and the EUV light reflectivity required to the reflective layer. In a case of Mo/Si reflective film, a reflective layer having a maximum value of EUV light beam reflectivity of at least 60% can be obtained by depositing a multilayer reflective film wherein a Mo layer having a thickness of $2.3\pm0.1$ nm and a Si layer having a thickness of $4.5\pm0.1$ nm are alternately laminated so that the number of repeating units becomes from 30 to 60.

Here, layers constituting the multilayer reflective film-deposition the reflective layer 3 may be each deposited by a known film-deposition method such as a magnetron sputtering method or an ion beam sputtering method so as to have a desired thickness. For example, in a case of depositing a Si/Mo multilayer reflective film by using an ion beam sputtering method, the film is preferably deposited by depositing a Si film by using a Si target as a target and Ar gas (gas pressure $1.3\times10^{-2}$ Pa to $2.7\times10^{-2}$ Pa) as a sputtering gas under an ion acceleration voltage of from 300 to 1,500 V at a film-deposition speed of from 0.03 to 0.30 nm/sec to have a thickness of 4.5 nm, and subsequently depositing a Mo film by using a Mo target as a target and Ar gas (gas pressure $1.3\times10^{-2}$ Pa to $2.7\times10^{-2}$ Pa) as a sputtering gas under an ion acceleration voltage of from 300 to 1,500 V at a film-deposition speed of from 0.03 to 0.30 nm/sec so as to have a thickness of 2.3 nm. Using the above process as one cycle, from 40 to 50 cycles of Si film and Mo film are laminated to deposit a Si/Mo multilayer reflective film. Here, the Si target is preferably a Si target doped with B in terms of electric conductivity.

In order to prevent oxidization of a surface of the reflective layer 3, the uppermost layer of the multilayer reflective film-deposition the reflective layer 3 is preferably a layer made of a material hard to be oxidized. The layer made of a material hard to be oxidized functions as a cap layer of the reflective layer 3. As a specific example of the layer made of a material hard to be oxidized functioning as a cap layer, a Si layer may be mentioned. When the multilayer reflective film-deposition the reflective layer 3 is a Si/Mo film, by providing a Si layer as the uppermost layer, such uppermost layer can function as a cap layer. In this case, the film thickness of the cap layer is preferably $11\pm2$ nm.

A protection layer may be deposited between the reflective layer 3 and the absorber layer 4. The protection layer is provided for the purpose of protecting the reflective layer 3 so that the reflective layer 3 is not damaged by etching at a time of forming a mask pattern in the absorber layer 4 by etching (usually dry etching). Accordingly, as the material of the protection layer, a material that is not susceptible to etching of the absorber layer, that is a material having an etching rate lower than that of the absorber layer 4 and that is hard to be damaged by the etching. As a material satisfying these conditions, Cr, Al, Ta and these nitrides, Ru and Ru compounds (RuB, RuSi, etc.), and $SiO_2$, $Si_3N_4$, $Al_2O_3$ and a mixture of these may, for example, be mentioned. Among these, Ru and Ru compounds (RuB, RuSi, etc.), CrN and $SiO_2$ are preferred, and Ru and Ru compounds (RuB, RuSi, etc.) are particularly preferred.

In a case of providing the protection layer, the thickness is preferably from 1 to 60 nm, particularly preferably from 1 to 40 nm.

In a case of providing the protection layer, the protection layer is deposited by using a known film-deposition method such as a magnetron sputtering method or an ion beam sputtering method. In a case of depositing Ru film by a magnetron sputtering method, the film is preferably deposited by using a Ru target as a target and Ar gas (gas pressure $1.0 \times 10^{-2}$ Pa to $10 \times 10^{-1}$ Pa) as a sputtering gas under an input power of from 30 to 1,500 V at a film-deposition speed of from 0.02 to 1.0 nm/sec so as to have a thickness of from 2 to 5 nm.

The characteristics particularly important for the absorber layer 4 is a sufficiently high contrast of EUV reflected light in relation to the reflective layer 3 (a protection layer when the protection layer is deposited on the reflective layer 3. This is applied to other embodiments). In order to achieve the above characteristics, it is preferred that the reflectivity of a surface of the absorber layer 4 for EUV light is extremely low. However, since the thickness of the absorber layer 4 is required to be thin, it is not realistic to sufficiently increase the contrast of EUV reflected light simply by lowering the reflectivity of a surface of the absorber layer 4 for EUV light. For this reason, it is preferred to sufficiently increase the contrast of EUV reflected light by using the principle of phase shift in relation to reflected light from the reflective layer 3.

In order to use the principle of phase shift in relation to reflected light from the reflective layer 3, the phase of EUV reflected light from the absorber layer 4 is preferably different from the phase of EUV reflected light from the reflective layer 3 by from 175 to 185°.

In a case of using the principle of phase shift, the reflectivity of a surface of the absorber layer 4 for EUV light is preferably from 5 to 15%. In order to sufficiently increase the contrast of EUV reflected light, the maximum value of the reflectivity of a surface of the absorber layer 4 for EUV light is preferably from 6 to 15%, more preferably from 7 to 15%. Here, "the maximum value of reflectivity" of EUV light means the value of the highest reflectivity among reflectivities of various measurement points on a surface of the absorber layer 4.

Further, in order to sufficiently increase the contrast of EUV reflected light, the phase difference between EUV reflected light from the absorber layer 4 and EUV reflected light from the reflective layer 3 is preferably from 175 to 185°, more preferably from 177 to 183°.

Here, when the contrast of EUV reflected light can be sufficiently increased without using the principle of phase shift, it is not necessary to provide a phase difference between EUV reflected light from the absorber layer 4 and EUV reflected light from the reflective layer 3. Here, even in this case, the reflectivity of a surface of the absorber layer 4 for EUV light preferably satisfies the above range.

In order to achieve the above characteristic, the absorber layer 4 is made of a material having a high absorption coefficient of EUV light. As the material having a high absorption coefficient of EUV light, a material containing tantalum (Ta) as the main component is preferred. In this specification, a material containing tantalum (Ta) as the main component means a material containing Ta in an amount of at most 40 at % in the material. The absorber layer 4 contains tantalum (Ta) in an amount of preferably at least 50 at %, more preferably at least 55 at %.

The material containing Ta as the main component to be used for the absorber layer 4 preferably contains besides Ta at least one component selected from the group consisting hafnium (Hf), silicon (Si), zirconium (Zr), germanium (Ge), boron (B), hydrogen (H) and nitrogen (N). A specific example of the material containing the above element other than Ta may, for example, be TaN, TaNH, TaHf, TaHfN, TaBSi, TaBSiN, TaB, TaBN, TaSi, TaSiN, TaGe, TaGeN, TaZr or TaZrN.

Here, the absorber layer 4 preferably contains no oxygen (O). Specifically, the content of O in the absorber layer 4 is preferably less than 25 at %. At a time of forming a mask pattern in the absorber layer of an EUV mask blank to produce an EUV mask, a dry etching process is usually used, and as an etching gas, a chlorine type gas (or a mixed gas containing a chlorine type gas) or a fluorine type gas (or a mixed gas containing a fluorine gas) is usually used. When a film containing Ru or a Ru compound is deposited as a protection layer on the reflective layer for the purpose of preventing a damage of the reflective layer by the etching process, a chlorine type gas is mainly used as the etching gas since the damage of the protection layer is small. However, if the absorber layer 4 contains oxygen at a time of carrying out a dry etching process by using a fluorine type gas, the etching rate decreases, and the resist damage increases, such being not preferred. The content of oxygen in the absorber layer 4 is preferably at most 15 at %, particularly preferably at most 10 at %, further preferably at most 5 at %.

The thickness of the absorber layer 4 is preferably selected so that the phase difference between EUV reflected light from the absorber layer 4 and EUV reflected light from the reflective layer 3 becomes from 175 to 185°. Further, the thickness of the absorber layer 4 is preferably from 10 to 60 nm, particularly preferably from 10 to 40 nm, further preferably from 10 to 30 nm.

The absorber layer 4 having the above construction may be deposited by carrying out a known film-deposition method such as a magnetron sputtering method or an ion beam sputtering method.

For example, in a case of depositing a TaHf film by using a magnetron sputtering method as the absorber layer 4, the film can be deposited by the following conditions.

Sputtering target: TaHf compound target (Ta=30 to 70 at %, Hf=70 to 30 at %)

Sputtering gas: an inert gas such as Ar gas (gas pressure $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa)

Degree of vacuum before film-deposition: at most $1 \times 10^{-4}$ Pa, preferably at most $1 \times 10^{-5}$ Pa, more preferably at most $10^{-6}$ Pa)

Input power: 30 to 1,000 W, preferably 50 to 750 W, more preferably 80 to 500 W

Film-deposition speed: 2.0 to 60 nm/min, preferably 3.5 to 45 nm/min, more preferably 5 to 30 nm/min As described above, in the EUV mask (A-2) (EUV mask 10 shown in FIG. 1) of the present invention, the first absorber layer 4a deposited in the EUV light-absorbing region 22 forms the same layer as the absorber layer 4 in the mask pattern region 21 in the stage of EUV mask blank before forming a mask pattern. Accordingly, with respect to the first absorber layer 4a, the above description as to the absorber layer 4 in the mask pattern region 21 can be applied in the same manner.

As described above, in the EUV mask (A-2) (EUV mask 10 shown in FIG. 1) of the present invention, the reflectivity of a surface of the second absorber layer 6 for EUV light is at most 1%. However, in the EUV mask (A-2) of the present invention, it is sufficient that a reflectivity of at most 1% for EUV light is achieved by the entire layer structure including the first absorber layer 4a and the second absorber layer 6, and it is not required to achieve a reflectivity of at most 1% for EUV light by the second absorber layer 6 alone. Here, the first absorber layer 4a and the second absorber layer 6 may be each a single layer or each a layer constituted by a plurality of layers.

Here, the reflectivity of a surface of the second absorber layer 6 for EUV light is more preferably at most 0.8%, further preferably at most 0.5%.

For the reason described above, the second absorber layer 6 is made of a material having a high absorption coefficient of EUV light in the same manner as the absorber layer 4. However, since the second absorber layer 6 deposited in the EUV light-absorbing region 22 is not required to have e.g. easiness of mask patterning and low reflectivity for mask pattern inspection light as differently from the absorber layer 4 in the mask pattern region 21, the material of the second absorber layer 6 may be selected from a wider range of materials than that of the absorber layer 4 in the mask pattern region 21.

As the material of the second absorber layer satisfying the above characteristics, a material containing as the main component at least one selected from the following elements and compounds is mentioned.

Germanium (Ge), aluminum (Al), titanium (Ti), nickel (Ni), tantalum nitride (TaN), zinc (Zn), copper (Cu), tellurium (Te), tantalum (Ta), hafnium (Hf), gallium (Ga), tin (Sn), bismuth (Bi), antimony (Sb), indium (In), osmium (Os), platinum (Pt), rhodium (Rh), cobalt (Co), manganese (Mn), palladium (Pd), rhenium (Re), ruthenium (Ru), vanadium (V), iridium (Ir), chromium (Cr), silver (Ag), thallium (Tl), tungsten (W), iron (Fe), gold (Au), titanium dioxide ($TiO_2$), palladium (Pd) and technetium (Tc)

Here, the second absorber layer 6 preferably has a characteristic different from that of the first absorber layer 4a in some process for producing EUV mask, besides the second absorber layer 6 is made of a material having a high absorption coefficient of EUV light.

Like the process (1) for producing an EUV mask of the present invention, in a case of producing an EUV mask from an EUV mask blank (A) having a first absorber layer and a second absorber layer, wherein the second absorber layer present in a portion to be a mask pattern region is removed to expose the first absorber layer, the second absorber layer preferably have the following characteristics.

The second absorber layer can be deposited under realistic conditions (preferably, the layer is depositable by a similar procedure to that of the first absorber layer by a sputtering method).

The second absorber layer is removable under realistic conditions (preferably, the layer is removable by etching with similar procedure to that of the first absorber layer).

The second absorber layer is distinguishable from the first absorber layer at a time of removal (at a time of removing the second absorber layer to expose the first absorber layer, an end point of removable of the second absorber layer can be judged).

As a suitable material to satisfy the above two characteristics, a material containing tantalum (Ta) as the main component that is mentioned as a material of the absorber layer 4 in the mask pattern region 21, may be mentioned. Here, in order to remove the second absorber layer to expose the first absorber layer in a portion to be a mask pattern region of an EUV mask, the second absorber layer is required to be distinguishable from the first absorber layer at the time of removal.

As a means for judging an end point at a time of removing the second absorber layer, a method of making the second absorber layer contain an element not contained in the first absorber layer, or a method of making the first absorber layer contain an element not contained in the second absorber layer, may be mentioned. An element to be contained for this purpose may, for example, be chromium (Cr), hafnium (Hf), zirconium (Zr), silicon (Si), or nitrogen (N) for the reason that change of light emission spectrum can be easily recognized at a time of carrying out an end point judgment by using a plasma light emission monitor.

Further, as another method, a method of selecting materials of the first absorber layer and the second absorber layer so that a sufficient etching selectivity can be obtained between these layers. Specifically, the ratio (etching selectivity) of the etching rate of the first absorber layer to the etching rate of the second absorber layer is preferably less than 0.1. The above etching selectivity is more preferably less than 0.05, further preferably less than 0.02. A combination of the first absorber layer and the second absorber layer satisfying such etching rates may, for example, be a combination of a first absorber layer made of TaHf and a second absorber layer made of TaNH, a combination of a first absorber layer made of TaNH and a second absorber layer made of CrN, or a combination of a first absorber layer made of TaHf and a second absorber layer made of CrN.

Here, as to be described later, when a low reflective layer for improving the contrast at a time of inspecting a mask pattern is present between the first absorber layer and the second absorber layer, the first absorber layer and the second absorber layer may be made of the same material since the end point of removing the second absorber layer can be judged by the presence of the low reflective layer. The first and second absorber layers are preferably made of the same material for the reason that their etching conditions can be the same.

In a case of using the EUV mask blank (C) of the present invention for producing an EUV mask, since the second absorber layer is present only on the first absorber layer present outside the mask pattern region, among the above three characteristics, the second absorber layer is only required to have a characteristic that it is depositable under realistic conditions.

A material of the second absorber layer satisfying this characteristic may, for example, be Ta, TaB, Hf, TaHf, Ti, Cr, Pt, Au, Pd or a nitride or an oxide of any of them.

The thickness of the second absorber layer 6 is preferably from 10 to 60 nm. If the thickness of the second absorber layer is less than 10 nm, although depending on the thickness of the first absorber layer, the reflectivity of a surface of the second absorber layer for EUV light may not be at most 1%. On the other hand, when the thickness of the second absorber layer exceeds 50 nm, increase of the thickness does not contribute to reduction of the reflectivity of a surface of the second absorber layer for EUV light any more, and for the reasons that a time to deposit the second absorber layer increases and a time to remove the second absorber layer in a case of using the process (1) for producing an EUV mask of the present invention increases, such being not preferred.

The thickness of the second absorber layer 6 is more preferably from 10 to 50 nm, further preferably from 10 to 30 nm.

The total thickness of the first absorber layer 4a and the second absorber layer 6 is preferably from 70 to 120 nm. If the total thickness of the first absorber layer and the second absorber layer is less than 70 nm, the reflectivity of a surface of the second absorber layer for EUV light may not be at most 1%. On the other hand, if the total thickness of the first absorber layer and the second absorber layer exceeds 120 nm, the increase in the thickness does not contribute to the reduction of the reflectivity of a surface of the second absorber layer for EUV light any more, and for the reasons that a time to deposit the first and second absorber layers increases, a time to remove the second absorber layer increases at a time of using the process (1) for producing an EUV mask of the present invention, and that a time to form a pattern of the absorber layer in the mask pattern region increases, such being not preferred.

The total thickness of the first absorber layer and the second absorber layer is more preferably from 75 to 110 nm, further preferably from 75 to 90 nm. However, considering the absorption coefficient of the absorber layer, they may be thinner layers, and in such a case, the total thickness of the first absorber layer and the second absorber layer is preferably from 50 to 120 nm, more preferably from 50 to 100 nm.

Here, in the EUV mask (A-3) of the present invention, that is, in the EUV mask 10' shown in FIG. 2, the thickness of the absorber layer 4b present in the EUV light-absorbing region 22 is within the same range as the total thickness of the first absorber layer and the second absorber layer. The range of the thickness of the absorber layer 4 in the mask pattern region 21 is similar to that of the EUV mask (A-2) of the present invention.

In the EUV mask (A-2) of the present invention, the second absorber layer can be deposited by carrying out a known film-deposition method such as a magnetron sputtering method or an ion beam sputtering method. For example, in a case of depositing a TaNH film as the second absorber layer, the film may be deposited by carrying out a magnetron sputtering method under the following conditions.

Sputtering target: Ta target

Sputtering gas: a mixed gas of Ar, $N_2$ and $H_2$ ($H_2$ gas concentration 1 to 50 vol %, preferably 1 to 30 vol %, $N_2$ gas concentration 1 to 80 vol %, preferably 5 to 75 vol %, Ar gas concentration 5 to 95 vol %, preferably 10 to 94 vol %, gas pressure $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa)

Input power: 30 to 1,000 W, preferably 50 to 750 W, more preferably 80 to 500 W

Figure 3:
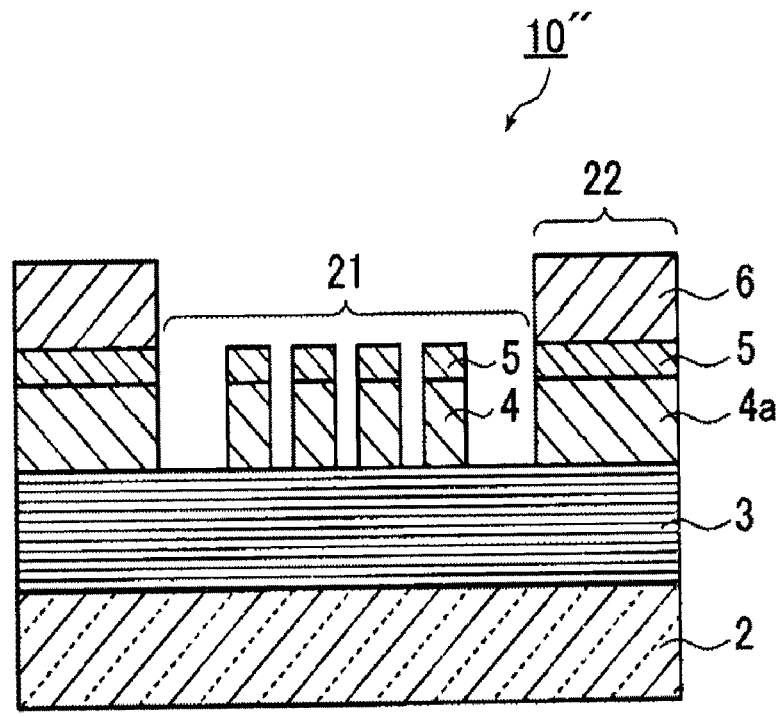
FIG. 3 is a schematic cross-sectional view showing an embodiment of EUV mask (B-1) of the present invention.

Film-deposition speed: 0.5 to 60 nm/min, preferably 1.0 to 45 nm/min, more preferably 1.5 to 30 nm/min The EUV mask of the present invention may have a constituent other than the substrate, the reflective layer, the absorber layer, the first absorber layer and the second absorber layer. FIG. 3 is a schematic cross-sectional view showing an example of the EUV mask (B-1) of the present invention. In the EUV mask 10" shown in FIG. 3, a low reflective layer 5 for improving the contrast at a time of inspecting a mask pattern (hereinafter referred to as "low reflective layer") is present on the absorber layer 4 in the mask pattern region 21, and a low reflective layer 5 is present between the first absorber layer 4a and the second absorber layer 6 in the EUV light-absorbing region 22. In short, the EUV mask (B-1) of the present invention has a low reflective layer on the absorber layer of the EUV mask (A-2) of the present invention. As described above, since the first absorber layer 4a in the EUV light-absorbing region 22 forms the same layer as the absorber layer 4 in the mask pattern region 21 in the stage of EUV mask blank before forming a mask pattern, when a low reflective layer is present on the absorber layer, a low reflective layer 5 is present between the first absorber layer 4a and the second absorber layer 6 in the EUV light-absorbing region 22.

Here, to the EUV mask (B-1), the above descriptions as to the substrate 2, the reflective layer 3 and the protection layer can be applied without modification.

At a time of forming an EUV mask, after a mask pattern is formed in the absorber layer, the mask pattern is inspected to check whether it is formed as designed. In this inspection of mask pattern, an inspection machine using light in the vicinity of 257 nm as inspection light is usually employed. Namely, the inspection is made with respect to the contrast of the reflected light in this wavelength range of about 257 nm. The absorber layer of EUV mask has an extremely low reflectivity for EUV light and is excellent in the properties of an absorber layer of EUV mask, but from the viewpoint of the wavelength region of inspection light, the reflectivity of such light is not sufficiently low, and there may be a case where a sufficient contrast is not obtained at the time of inspecting a mask pattern. If a sufficient contrast is not obtained, defects cannot be sufficiently recognized at a time of mask pattern inspection, and an accurate defect inspection cannot be performed.

When a low reflective layer for improving the contrast at a time of mask pattern inspection is deposited on the absorber layer, the reflectivity of a surface of the low reflective layer for mask pattern inspection light incident into the low reflective layer becomes extremely low, whereby the contrast at the time of mask pattern inspection improves. Specifically, the reflectivity of a surface of the low reflective layer 5 for mask pattern inspection light incident into the low reflective layer 5 is preferably at most 15%, more preferably at most 10%, further preferably at most 5%.

The low reflective layer 5 is preferably made of a material having a refractive index at the wavelength of inspection light lower than that of the absorber layer 4 in order to achieve the above characteristic.

The low reflective layer 5 is preferably made of a material containing tantalum (Ta) as the main component. The material of the low reflective layer 5 containing Ta as the main component contains besides Ta at least one component selected from the group consisting of hafnium (Hf), germanium (Ge), silicon (Si), boron (B), nitrogen (N), hydrogen (H) and oxygen (O).

As a specific example of the material containing the above element other than Ta may, for example, be TaO, TaON, TaONH, TaHfO, TaHfON, TaBNO, TaBSiO or TaBSiON.

In the mask pattern region 21, the total thickness of the absorber layer 4 and the low reflective layer 5 is preferably from 10 to 65 nm, more preferably from 30 to 65 nm, further preferably from 35 to 60 nm. Further, since the EUV light-absorbing characteristic may decrease if the thickness of the low reflective layer 5 is thicker than the thickness of the absorber layer 4, the thickness of the low reflective layer 5 is preferably thinner than the thickness of the absorber layer. For this reason, the thickness of the low reflective layer 5 is preferably from 1 to 20 nm, more preferably from 3 to 15 nm, further preferably from 5 to 10 nm.

In the EUV light-absorbing region 22, the total thickness of the first absorber layer 4a, the low reflective layer 5 and the second absorber layer 6 is preferably from 12 to 100 nm, more preferably from 15 to 100 nm, further preferably from 15 to 90 nm. Here, the first absorber layer 4a, the low reflective layer 5 and the second absorber layer 6 may be each a single layer or each a layer constituted by a plurality of layers.

Here, the absorber layer 4 and the first absorber layer 4a are preferably made of the same material, more preferably they further have the same thickness for the purpose of improving patterning characteristics.

Even though the EUV mask (B-1) of the present invention has a low reflective layer, the mask preferably has the same characteristics as those of the EUV mask (A-1) of the present invention.

For example, in order to use the principle of phase shift in relation to reflected light from the reflective layer 3, the phase of EUV reflected light from the low reflective layer 5 is preferably different from the phase of EUV reflected light from the reflective layer 3 by from 175 to 185°. Further, in a case of using the principle of phase shift, the reflectivity of a surface of the low reflective layer 5 for EUV light is preferably from 5 to 15%. In order to sufficiently increase the contrast of EUV reflected light, the maximum value of the reflectivity of a surface of the low reflective layer 5 for EUV light is preferably from 6 to 15%, more preferably from 7 to 15%.

Further, in order to sufficiently increase the contrast of EUV reflected light, the phase difference between EUV reflected light from the low reflective layer 5 and EUV reflected light from the reflective layer 3 is preferably from 176 to 184°, more preferably from 177 to 183°.

The low reflective layer 5 can be deposited by carrying out a known film-deposition method such as a magnetron sputtering method or an ion beam sputtering method.

For example, in a case of depositing a TaHfO film as the low reflective layer 5 by using an ion beam sputtering method, the film can be deposited by carrying out the method under the following film-deposition conditions.

Sputtering target: TaHf compound target (Ta=30 to 70 at %, Hf=70 to 30 at %)

Sputtering gas: a mixed gas of Ar and $O_2$ ($O_2$ gas concentration 3 to 80 vol %, preferably 5 to 60 vol %, more preferably 10 to 40 vol %; gas pressure $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa)

Input power: 30 to 1,000 W, preferably 50 to 750 W, more preferably 80 to 500 W

Film-deposition speed: 2.0 to 60 nm/min, preferably 3.5 to 45 nm/min, more preferably 5 to 30 nm/min The first absorber layer 4a and the second absorber layer 6 preferably have the above-described materials and thicknesses and are preferably deposited by the above-described method. However, when the EUV mask has a layer construction having the first absorber layer 4a, the low reflective layer 5 and the second absorber layer 6, then, considering etching properties and reflectivities for EUV light, the first absorber layer 4a, the low reflective layer 5 and the second absorber layer 6 are preferably each a film containing Ta as the main component. Further, considering the etching properties and reflectivities for EUV light, the first absorber layer 4a, the low reflective layer 5 and the second absorber layer 6 are preferably each a film containing Ta as the main component and containing also nitrogen. The amount of nitrogen is preferably from 2 to 45 at %, particularly preferably from 3 to 40 at % in each of these layers. Further, considering selectivity of etching gas, the content of oxygen in the first absorber layer 4a and the second absorber layer 6 is preferably at most 15 at %, particularly preferably at most 10 at %, further preferably at most 5 at %. Meanwhile, the content of oxygen in the low reflective layer is preferably from 30 to 70 at %.

The second absorber layer 6 also preferably has characteristics similar to those of EUV mask (A-1) of the present invention even if the mask has a low reflective layer.

Like the process (2) for producing an EUV mask of the present invention to be described later, in a case of producing an EUV mask from an EUV mask blank (B) having the second absorber layer on the entire surface of the low reflective layer, wherein the second absorber layer present in a portion to be a mask pattern region is removed to expose the low reflective layer, the second absorber layer is required to be distinguishable from the low reflective layer at the time of removal. To satisfy requirement, a method of selecting the materials of the first reflective layer and the second absorber layer so that a sufficient etching selectivity between these layers is obtained, may be mentioned. Specifically, the materials of the low reflective layer and the second absorber layer are preferably selected so that the ratio (etching selectivity) of the etching rate of low reflective layer to the etching rate of the second absorber layer becomes less than 0.1. Specifically, for example, by selecting TaON for the low reflective layer and CrN for the absorber layer, an etching selectivity of about 0.03 can be obtained in an wet etching using a ceritic ammonium nitrate solution.

The above etching selectivity is more preferably less than 0.05, further preferably less than 0.02.

The EUV mask of the present invention may have a known functional film known in the field of EUV mask besides the above-described construction, that is the reflective layer, the protection layer, the absorber layer, the first absorber layer, the second absorber layer and the low reflective layer. A specific example of such a functional film may be a high-dielectric coating provided on a rear surface of the substrate for facilitating electrostatic chucking of the substrate described in JPA-2003-501823. Here, the rear surface of the substrate means a surface of the substrate of UV mask opposite from a surface on which the reflective layer is deposited. The electric conductivity and the thickness of the material of such a high dielectric coating to be provided on the rear surface of the substrate for such a purpose, are selected so that the sheet resistance becomes at most 100Ω/□. The material of the high dielectric coating may be selected from a wide range of materials described in known documents. For example, a high dielectric coating described in JP-A-2003-501823, specifically, a coating made of silicon, TiN, molybdenum, chromium or TaSi may be employed. The thickness of such a high dielectric coating may, for example, be from 10 to 1,000 nm.

The high dielectric coating can be formed by a known film-deposition method, for example, a sputtering method such as a magnetron sputtering method or an ion beam sputtering method, a CVD method, a vacuum vapor deposition method or an electrolytic plating method.

Figure 4:
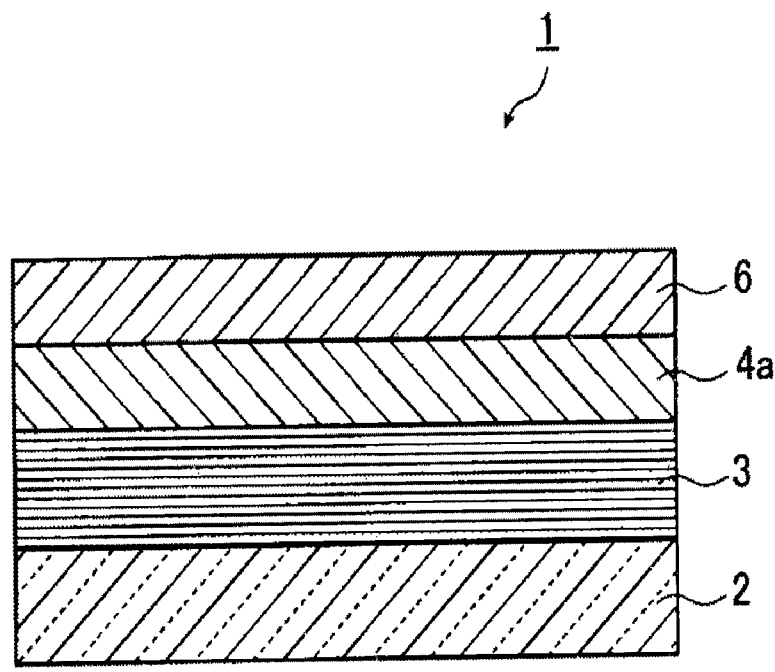
FIG. 4 is a schematic cross-sectional view showing an embodiment of EUV mask blank (A) of the present invention.

Next, the EUV mask blank of the present invention will be described. FIG. 4 is a schematic cross-sectional view showing an embodiment of EUV mask blank (A) of the present invention. An EUV mask blank 1 shown in FIG. 4 has a substrate 2, and a reflective layer 3, a first absorber layer 4a and a second absorber layer 6 in this order deposited on the substrate 2. The first absorber layer 4a becomes an absorber layer in a mask pattern region and a first absorber layer in an EUV light-absorbing region when an EUV mask is produced by patterning the EUV mask blank 1.

Accordingly, with respect to the material, the thickness, required characteristics and the method for formation of each of the constituents of the EUV mask blank 1, descriptions of corresponding portions of EUV mask may be referred.

Figure 5:
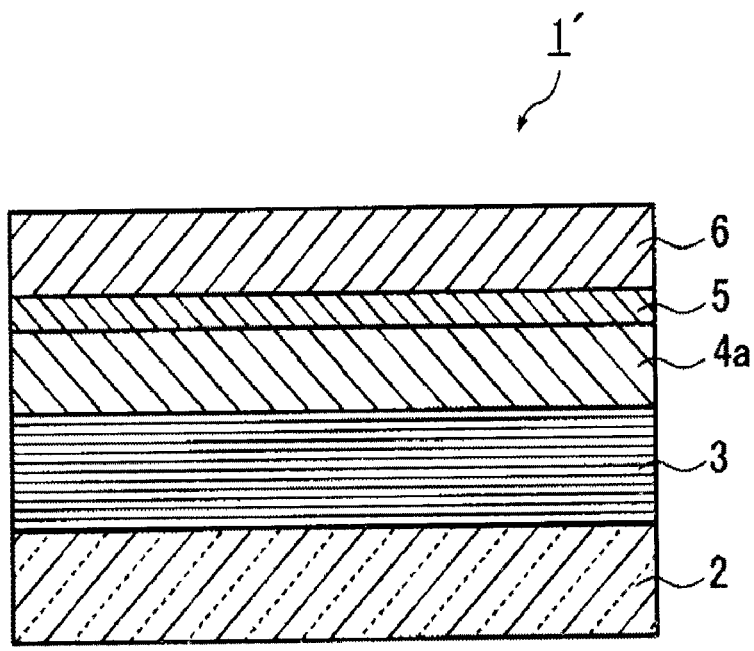
FIG. 5 is a schematic cross-sectional view showing an embodiment of EUV mask blank (B) of the present invention.

FIG. 5 is a schematic cross-sectional view showing an embodiment of EUV mask blank (B) of the present invention. An EUV mask blank 1' shown in FIG. 5 is the same as the EUV mask blank 1 shown in FIG. 4 except that the EUV mask blank 1' has a low reflective layer 5 between a first absorber layer 4a and a second absorber layer 6.

With respect to the material, the thickness, required characteristics and forming method, etc. of the EUV mask blank 1', descriptions of corresponding portions of EUV mask may be referred.

Figure 6:
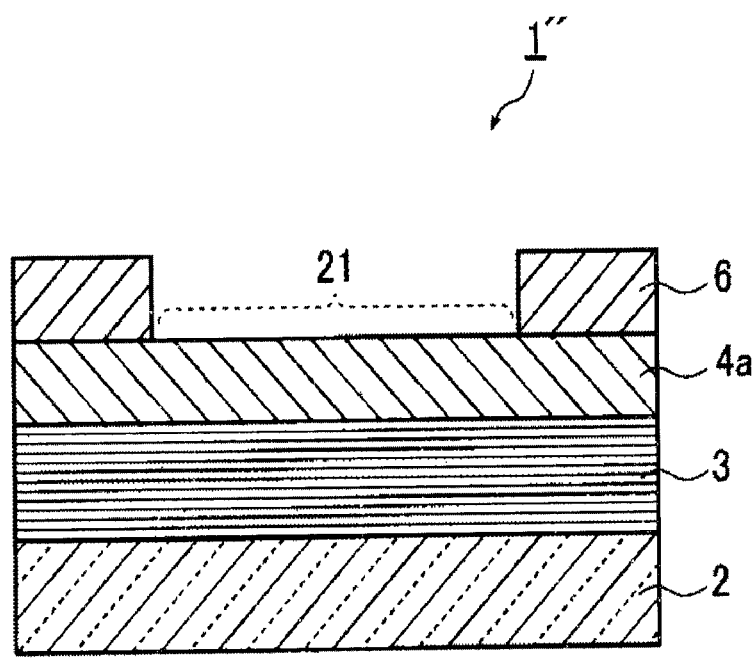
FIG. 6 is a schematic cross-sectional view showing an embodiment of EUV mask blank (C) of the present invention.

FIG. 6 is a schematic cross-sectional view showing an embodiment of EUV mask blank (C) of the present invention. An EUV mask blank 1" shown in FIG. 6 is the same as the EUV mask blank 1 shown in FIG. 4 except that the EUV mask blank 1" has a reflective layer 3 and a first absorber layer 4a in this order on a substrate 2. Here, in the EUV mask blank 1" shown in FIG. 6, the second absorber layer 6 is present only on the first absorber layer 4 outside a portion to be a mask pattern region 21 in an EUV mask produced by EUVL.

In order to deposit the second absorber layer 6 only on the first absorber layer 4 outside the portion to be the mask pattern region 21 in the EUV mask, the absorber layer can be deposited by depositing the reflective layer 3 and the first absorber layer 4 in this order on the substrate 2, and depositing the second absorber layer 6 in a state that a portion of the first absorber layer 4 to be the mask pattern region 21 in the EUV mask is covered by a masking.

Here, in order to prevent adhesion of foreign bodies to the mask blank or damaging of the mask blank, the masking to be employed for deposition of the second absorber layer is preferably disposed so as to have a gap of from about 0.2 to 1.0 mm from the mask blank without contacting the mask blank. In this case, a supporting portion for fixing the masking needs to be provided on the mask blank. In some type of mask blank, a trace of such a supporting portion (that is a portion wherein deposition of the second absorber layer is prevented by the presence of the supporting portion) is not tolerable. In such a case, it is possible to avoid such a trace of the supporting portion by employing two maskings wherein the position of the supporting position is different, and carrying out deposition of the second absorber layer in two steps.

The EUV mask blank (C) of the present invention may have a low reflective layer on the first absorber layer. In this case, the second absorber layer 6 is present on the low reflective layer only outside a portion to be a mask pattern region 21 in an EUV mask to be produced by EUVL. In this case, a low reflective layer is present between the first absorber layer 4a and the second absorber layer 6 outside a portion to be a mask pattern region 21 in an EUV mask produced by employing the EUV mask blank.

Further, in this case, in order to deposit the second absorber layer only outside a portion to be a mask pattern region in the EUV mask, the second absorber layer can be deposited by depositing the reflective layer, the first absorber layer and the low reflective layer in this order on the substrate, and depositing the second absorber layer in a state that a portion of the low reflective layer to be a mask pattern region in the EUV mask is covered with a masking.

Next, the process for producing an EUV mask of the present invention will be described.

A process (1) for producing an EUV mask of the present invention is a process for producing an EUV mask (A-1) by employing an EUV mask blank (A) of the present invention. Using the EUV mask blank 1 shown in FIG. 4 as an example, the process (1) for producing an EUV mask of the present invention will be described.

Figure 7:
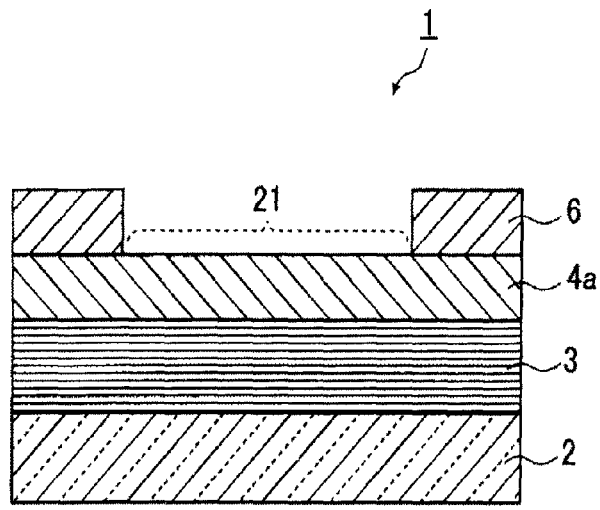
FIG. 7 is a view for explaining the process (1) for producing EUV mask of the present invention.

In the process (1) for producing an EUV mask of the present invention, first, in the EUV mask blank 1, a portion of the second absorber layer 6 present in a portion to be a mask pattern region 21 in an EUVL mask to be produced, is removed to expose the first absorber layer 4a. FIG. 7 shows the mask blank 1 after this step. Removal of the second absorber layer 6 may be carried out by a process usually used for forming a mask pattern by a photolithography process. Specifically, for example, the removal may be carried out by the following process.

A resist film is deposited on the second absorber layer 6.

A patterning exposure of the photoresist film to an electron beam or UV rays is carried out.

The resist film after the patterning exposure is developed to form a resist pattern.

An etching process is carried out to remove a portion of the second absorber layer 6 not covered with the resist film.

As the etching process for removing the second absorber layer 6, a dry etching process or a wet etching process may be employed.

Next, a photolithography process is carried out to form a mask pattern in the first absorber layer 4 exposed to the outside by the above process. By this process, an EUV mask shown in FIG. 1 is produced. Here, the process of carrying out the photolithography process to form the mask pattern in the absorber layer 4, may be a common process employed for forming a mask pattern of an EUV mask or a photomask for a dioptric system.

A process (2) for producing an EUV mask of the present invention is a process for producing an EUV mask (B-1) by employing the EUV mask (B) of the present invention.

The process (2) for producing an EUV mask of the present invention is the same as the process (1) for producing an EUV mask of the present invention except that a low reflective layer 5 is exposed to the outside by removing the second absorber layer 6 present in a portion to be a mask pattern region 21 in an EUV mask to be produced in the process (2), and that mask-patterning of both the low reflective layer 5 and the first absorber layer 4 present under the low reflective layer 5 is carried out by a photolithography process in the process (2).

An EUV mask (A-3) of the present invention can also be produced by a process similar to the above process.

An EUV mask blank to be employed for producing the EUV mask (A-3) of the present invention has a structure wherein a reflective layer and an absorber layer are present in this order on a substrate, and the absorber layer has a thickness corresponding to that of the absorber layer 4b in the EUV light-absorbing region 22 of the EUV mask 10' shown in FIG. 2. In order to produce the EUV mask (A-3) by employing such an EUV mask blank, the EUV mask (3-A) can be produced by removing an absorber layer 4b present in a portion to be a mask pattern region in an EUV mask to be produced so that the absorber layer 4b has a predetermined thickness, specifically, by removing the absorber layer 4b so that the thickness of remaining absorber layer 4b becomes the thickness of the absorber layer 4 in the mask pattern region 21 of the EUV mask 10', followed by forming a mask pattern in the absorber layer 4b present in the portion to be the mask pattern region 21 by a photolithography process.

In a case of producing an EUV mask (A-2) by using the EUV mask blank (C), since the first absorber layer 4a in a portion to be a mask pattern region 21 in an EUV mask to be produced, is exposed to the outside, the EUV mask (A-2) can be produced by forming a mask pattern in the absorber layer present in a portion to be the mask pattern region 21, by a photolithography process.

In the EUV mask blank (C) of the present invention, in a case of depositing a low reflective layer on the first absorber layer, the low reflective layer may be deposited by forming a mask pattern in the low reflective layer present in a portion to be a mask pattern region in the EUV mask, by a photolithography process.

In a case of producing an EUV mask (A-2) by employing the EUV mask blank (A) of the present invention, the following process may be carried out.

Figure 8:
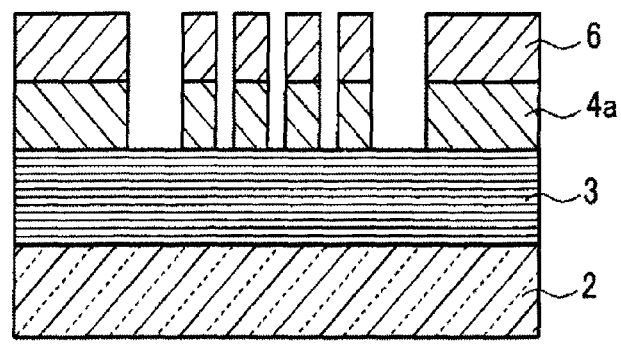
FIG. 8 is a view for explaining the process for producing EUV mask of the present invention.
Figure 9:
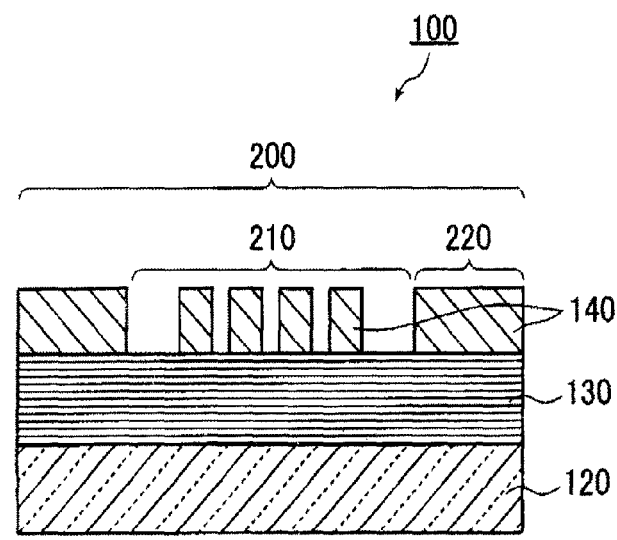
FIG. 9 is a schematic cross-sectional view showing an example of the construction of a conventional EUV mask.

For example, in a case of an EUV mask blank 1 shown in FIG. 4, a mask pattern through both a second absorber layer 6 and a first absorber layer 4 present under the second absorber layer 6 in a portion to be a mask pattern region in an EUV mask to be produced by employing the EUV mask blank, is formed by a photolithography process. FIG. 8 shows a EUV mask blank 1 after this step.

Next, by a photolithography process, the second absorber layer 6 present in a portion to be a mask pattern in the EUV mask is removed by a photolithography process to expose the first absorber layer 4 to the outside. By this step, an EUV mask 10 shown in FIG. 1 is produced.

In a case of producing an EUV mask (B-1) from the EUV mask blank (B) of the present invention, a similar process can be carried out. For example, in a case of an EUV mask blank 1' shown in FIG. 5, a mask pattern through a second absorber layer 6 and a low reflective layer 5 and a first absorber layer 4a that are present under the second absorber layer 6 present in a region to be a mask pattern region in an EUV mask to be produced by employing the EUV mask blank, is formed by a photolithography process. Next, by a photolithography process, the absorber layer 6 present in a portion to be the mask pattern region in the EUV mask is removed to expose the low reflective layer 5 to the outside. By this process, an EUV mask 10" shown in FIG. 3 is produced.

Next, a process for producing a semiconductor integrated circuit using the EUV mask of the present invention will be described. The EUV mask of the present invention can be applied to a process for producing a semiconductor integrated circuit using a photolithography process using EUV light as a light source for exposure. Specifically, a substrate such as a silicon wafer coated with a resist is disposed on a stage, the EUV mask of the present invention is disposed on a catoptric type exposure apparatus constituted by a combination of reflective mirrors. Then, EUV light is emitted from a light source and incident into the EUV mask via the reflective mirrors, and the EUV light is reflected by the EUV mask and incident into the substrate coated with a resist. By this transferring step, a circuit pattern is transferred onto the substrate. The substrate on which the circuit pattern is transferred is subjected to a developing process to etch an exposed portion or a non-exposed portion, and the resist is removed. The semiconductor integrated circuit is produced by repeating such a step.

EXAMPLES

Now, the present invention will be described in further detail with reference to Examples.

Example 1

In this Example, an EUV mask blank 1 shown in FIG. 4 is produced.

As a substrate 2 for film-deposition, a $SiO_2$—$TiO_2$ type glass substrate (external shape about 6 inch (about 152 mm) square, the thickness about 6.3 mm) is employed. The glass substrate has a thermal expansion coefficient of $0.02 \times 10^{-7}/°$ C., a Young's modulus of 67 GPa, a Poisson's ratio of 0.17 and a specific rigidity of $3.07 \times 10^7$ $m^2/s^2$. By polishing the glass substrate to have a smooth surface having a surface roughness (rms) of at most 0.15 nm and a flatness of at most 100 nm.

By depositing a Cr film having a thickness of 100 nm on a rear surface of the substrate 2 by using a magnetron sputtering method, a high dielectric coating having a sheet resistance of $100\Omega/\square$ is provided.

On a common electrostatic chuck having a flat plate shape, the substrate 2 (external shape 6 inch (152 mm) square, thickness 6.3 mm) is fixed by using the deposited Cr film, and deposition of a Si film and a Mo film on a surface of the substrate 2 by using an ion beam sputtering method is repeated 40 cycles to deposit a Si/Mo multilayer reflective film (reflective layer 3) having a total film thickness of 272 nm ((4.5 nm+2.3 nm)×40).

Further, on the Si/Mo multilayer reflective film (reflective layer 3), a Ru film (thickness 2.5 nm) by using an ion beam sputtering method to deposit a protection layer (not shown).

Film-deposition conditions of the Si film, Mo film and Ru film are as follows.

Film-Depositing Conditions of Si Film
  Target: Si target (boron-doped)
  Sputtering gas: Ar gas (gas pressure 0.02 Pa)
  Voltage: 700 V
  Film-deposition speed: 0.077 nm/sec
  Film thickness: 4.5 nm Film-Depositing Conditions of Mo Film
  Target: Mo target
  Sputtering gas: Ar gas (gas pressure 0.02 Pa)
  Voltage: 700 V
  Film-deposition speed: 0.064 nm/sec
  Film thickness: 2.3 nm Film-Depositing Conditions of Ru Film
  Target: Ru target
  Sputtering gas: Ar gas (gas pressure 0.02 Pa)
  Voltage: 500 V
  Film-deposition speed: 0.023 nm/sec
  Film thickness: 2.5 nm Next, on the protection layer, a first absorber layer 4a (TaHf film) containing Ta and Hf is deposited by using a magnetron sputtering method, to obtain a mask blank having the substrate 2 and the reflective layer 3, the protection layer and the first absorber layer 4a present in this order on the substrate 2. Here, the mask blank is a mask blank (mask blank for evaluation of first absorber layer) for measuring the reflectivity of a surface of the first absorber layer 4a for EUV light.

The film-deposition conditions of the first absorber layer 4a are as follows. The first absorber layer a has a thickness expected to be required to use the principle of phase shift in relation to reflected light from the reflective layer 3.

Specifically, the thickness is 44 nm.

Film-Deposition Conditions of First Absorber Layer 4a (Tahf Film)
  Target: TaHf target
  Sputtering gas: Ar (gas pressure 0.46 Pa)
  Input power: 700 W
  Film-deposition speed: 6.2 nm/min
  Film composition: the content of Ta is 55 at %, and the content of Hf is 45 at %

Next, on the first absorber layer 4a of the mask blank for evaluation of the first absorber layer obtained by the above process, the second absorber layer 6 (TaNH film) containing Ta, N and H is deposited by using a magnetron sputtering method, to obtain an EUV mask blank 1 having the substrate 2, and the reflective layer 3, the protection layer, the first absorber layer 4a and the second absorber layer 6 in this order on the substrate 2.

The film-deposition conditions of the first absorber layer are as follows. Here, the thickness of the second absorber layer 6 is adjusted so that the total film thickness of the second absorber layer 6 and the first absorber layer 4a becomes 78 nm so that the reflectivity for EUV light (13.5 nm) becomes at most 1%.

Film-Deposition Conditions of Second Absorber Layer 6 (Tanh Film)
  Target: Ta target
  Sputtering gas: mixed gas of Ar, $N_2$ and $H_2$ (Ar: 89 vol %, $N_2$: 8.3 vol %, $H_2$: 2.7 vol %, gas pressure: 0.46 Pa)
  Input power: 300 W
  Film-deposition speed: 1.5 nm/min
  Film composition: the content of Ta is 58.1 at %, the content of N is 38.5 at %, and the content of H is 3.4 at %

Evaluation of Reflectivity for EUV Light

EUV light (wavelength 13.5 nm) is radiated to a surface of the first absorber layer 4a of a mask blank for first absorber layer evaluation obtained by the above process, and the reflectivity of a surface of the first absorber layer 4a for EUV light is measured. In the same manner, EUV light (wavelength 13.5 nm) is radiated to a surface of the second absorber layer 6 of the EUV mask blank 1 obtained by the above process, and the reflectivity of a surface of the second absorber layer 6 for EUV light is measured.

Here, the measurement method of reflectivity for EUV light is as follows.

A synchrotron radiation beam is separated by spectroscopic method to obtain EUV light having a desired wavelength, and the intensity of EUV light that is directly incident into a photodiode is measured, and subsequently, the EUV light is incident from a direction at 6° to a normal line to a surface of the mask blank, and the intensity of reflected light is measured. By calculating the ratio of the reflected light intensity to the direct light intensity thus measured, it is possible to obtain the reflectivity for a desired wavelength.

The results are as follows.
(Reflectivity of a Surface of First Absorber Layer 4a For Euv Light)
  5.2% when the thickness is 44 nm
(Reflectivity of a Surface of Second Absorber Layer 6 For Euv Light)
  0.4% when the total thickness of this layer and the first absorber layer 4a is 78 nm.

The reflectivity of a surface of the second absorber layer 6 for EUV light is at most 1%, which is a sufficiently low reflectivity for the layer to function as an EUV light-absorbing region to be provided outside a mask pattern region.

Further, in Example 1, the phase difference between EUV reflected light from the absorber layer 4 and EUV reflected light from the reflective layer 3 is about from 177 to 183.

By constructing an EUV mask an example of which is shown in FIG. 1, wherein the first absorber layer 4a and the second absorber layer 6 are combined, it is expected to be possible to use the principle of phase shift in relation to reflected light from the reflective layer in the mask pattern region, and to reduce the reflectivity of EUV light from the outside of the mask pattern region, and thereby to suppress unnecessary exposure of a resist on the substrate due to reflected light from outside the mask pattern region.

Example 2

In this Example, an EUV mask blank 1' shown in FIG. 5 will be produced.

On a substrate 2, a reflective layer 3, protection layer (not shown), a first absorber layer 4a, a low reflective layer 5 and a second absorber layer 6 are deposited in this order to obtain an EUV mask blank. Each constituent of the EUV mask blank is as follows.

Substrate 2: $SiO_2$—$TiO_2$ type glass substrate (external shape about 6 inch (about 152 mm) square, the thickness is 6.3 mm)

Reflective layer 3: Si/Mo multilayer reflective film, in a Si/Mo repeating unit, the thickness of Si film is 2.5 nm and the thickness of Mo film is 2.3 nm, and the total film thickness is 272 nm ((4.5 nm+2.3 nm)×40)

Protection layer: Ru film, film thickness 2.5 nm
First absorber layer 4a: TaNH film, film thickness 40 nm
Low reflective layer: TaON film, film thickness 7 nm
Second absorber layer 6: CrN film, film thickness 35 nm Film-Deposition Conditions of Magnetron Sputtering Method for First Absorber Layer 4a (Tanh Film)
  Target: Ta target
  Sputtering gas: mixed gas of Ar, $N_2$ and $H_2$ (Ar: 89 vol %, $N_2$: 8.3 vol %, $H_2$: 2.7 vol %, gas pressure: 0.46 Pa)
  Input power: 300 W
  Film-deposition speed: 1.5 nm/min
  Film composition: the content of Ta is 58.1 at %, the content of N is 38.5 at %, and the content of H is 3.4 at %

Film-Deposition Conditions of Magnetron Sputtering Method for Low Reflective Layer 5 (Taon Film)
  Target: Ta target
  Sputtering gas: Ar, $N_2$ and $O_2$ (Ar: 50 vol %, $N_2$: 13 vol %, $O_2$: 37 vol %, gas pressure: 0.3 Pa)
  Input power: 150 W
  Film-deposition speed: 5.1 nm/min
  Film thickness: 7 nm
  Film composition: the content of Ta is 22 at %, the content of O is 65 at %, and the content of N is 13 at %

Film-Deposition Conditions of Magnetron Sputtering Method for Second Absorber Layer 6 (Crn Film)
  Target: Cr target
  Sputtering gas: mixed gas of Ar and $N_2$ (Ar: 80 vol %, $N_2$: 20 vol %, gas pressure: 0.2 Pa)
  Input power: 500 W
  Film-deposition speed: 5.2 nm/min
  Film composition: the content of Cr is 64.5 at %, and the content of N is 35.5 at %

Here, the film-deposition conditions of Si film, Mo film and Ru film are the same as those of Example 1.

To this EUV mask blank, formation of simulated mask pattern is carried out by a photolithography process. Specifically, a UV-sensitive positive resist film is deposited on the entire surface of the second absorber layer of the EUV mask blank, and the mask pattern region is exposed to UV rays, and the resist is developed to form a resist pattern. Thereafter, by carrying out a wet etching process using cerium ammonium nitrate (Cr etching solution), the CrN film (second absorber layer) in the entire surface of the mask pattern region is removed. Thereafter, the UV-sensitive positive resist film remaining in the EUV light-absorbing region provided outside the mask pattern region is removed by using 5% KOH.

The mask blank from which the second absorber layer in the mask pattern region is removed by the above process is cleaned, and a photoresist film of a positive resist FEP171 (Fuji Film Electronics Materials Co., Ltd.) is deposited on the mask blank. Further, a desired pattern is drawn on the resist film in the mask pattern region by using an electron beam lithography machine, and development is carried out. Subsequently, by using an ICP (reactive ion) etching apparatus, the TaON film in the mask pattern region is removed by a dry etching process by using $CF_4$ gas as an etching gas, and the TaNH film is removed by an etching process by using $Cl_2$ diluted by He as an etching gas. As a result, the Ru film is exposed to the outside in the mask pattern region.

After removal of the TaON film and TaNH film, the resist film remaining on the mask blank is removed by cleaning, to form an EUV mask an example of which is shown in FIG. 3. EUV light (wavelength 13.5 nm) is radiated to a surface of the Ru film and a surface of the CrN film of the produced EUV mask, to measure the reflectivity of the surface of Ru film and the surface of the CrN film for EUV light.

In the mask pattern region of EUV mask, the reflectivity of a surface of the Ru film corresponding to a portion wherein the protection layer is exposed to the outside, for EUV light is 63%. The reflectivity of a surface of the low reflective layer 5 for EUV light is 5.3%. The reflectivity of a surface of the CrN film corresponding to the EUV light-absorbing region provided outside the mask pattern region for EUV light is less than 0.5%.

Examples 3 to 5

In these Examples, an EUV mask blank (C) of the present invention will be produced. The mask blank to be produced has a construction wherein a low reflective layer is provided on the first absorber layer 4a of the EUV mask blank 1" shown in FIG. 6 (a construction wherein a low reflective layer is provided between the first absorber layer 4a and the second absorber layer 6).

Example 3

A mask blank having a substrate 2 and a reflective layer 3, a protection layer (not shown), a first absorber layer 4a and a low reflective layer (not shown) are deposited in this order on the substrate 2 is prepared, and a second absorber layer 6 is deposited in a state that a mask pattern region of the mask blank is covered by a masking, to obtain an EUV mask blank. The film-deposition conditions for each layer are the same as those of Example 2.

The constituents of the EUV mask blank are as follows.
Substrate 2: $SiO_2$—$TiO_2$ type glass substrate (external shape about 6 inch (about 152 mm) square, the thickness is about 6.3 mm)
Reflective layer 3: Si/Mo multilayer reflective film, in a Si/Mo repeating unit, the thickness of Si film is 2.5 nm and the thickness of Mo film is 2.3 nm, and the total film thickness is 272 nm ((4.5 nm+2.3 nm)×40)
Protection layer: Ru film, film thickness 2.5 nm
First absorber layer 4a: TaNH film, film thickness 40 nm
Low reflective layer: TaON film, film thickness 7 nm
Second absorber layer 6: CrN film, film thickness 35 nm To this EUV mask blank, formation of a simulated mask pattern is carried out by a photolithography process. A resist film of a positive resist FEP171 (Fuji Film Electronics Materials Co., Ltd.) is deposited, and a desired pattern is drawn on the resist film in the mask pattern region by using an electron beam lithography machine, and development is carried out. Subsequently, by using an ICP (reactive ion) etching apparatus, the TaON film is removed by a dry etching process by using $CF_4$ gas as an etching gas. Subsequently, the TaNH film is removed by a etching process by using $Cl_2$ diluted by He as an etching gas. As a result, the Ru film in the mask pattern region is exposed to the outside.

After removal of the TaON film and TaNH film, the resist film remaining on the mask blank is removed by cleaning, to form an EUV mask an example of which is shown in FIG. 3. EUV light (wavelength 13.5 nm) is radiated to a surface of the Ru film and a surface of the CrN film of the EUV mask to measure the reflectivity of a surface of Ru film and a surface of the CrN for EUV light.

In the mask pattern region of EUV mask, the reflectivity of a surface of the Ru film corresponding to a portion wherein the protection layer is exposed to the outside for EUV light is 63%. The reflectivity of a surface of the low reflective layer 5 for EUV light is 5.3%. The reflectivity of a surface of the CrN film corresponding to the EUV light-absorbing region provided outside the mask pattern region for EUV light is less than 0.5%.

Example 4

Example 4 is carried out in the same manner as Example 3 except that TaNH (50 nm), Ti film (50 nm), TaHf film (35 nm) or TaHfON film (35 nm) is deposited instead of CrN film as the second absorber layer 6.

The film-deposition conditions of each film are as follows.
Film-Deposition Conditions of Tanh Film: The Same As Example 1
Film-Deposition Conditions of Ti Film (Magnetron Sputtering Method)
  Target: Ti target
  Sputtering gas: Ar (Ar: 100 vol %, gas pressure 0.25 Pa)
  Input power: 350 W
  Film-deposition speed: 8.9 nm/min
  Film composition: the content of Ti is 100 at %
Film-Deposition Conditions of Tahf Film: The Same As Example 1
Film-Deposition Conditions of Tahfon Film (Magnetron Sputtering Method)
  Target: TaHf compound target (composition ratio: Ta 55 at %, Hf 45 at %)
  Sputtering gas: mixed gas of Ar, $N_2$ and $O_2$ (Ar: 45 vol %, $N_2$: 23 vol %, $O_2$: 32 vol %, gas pressure: 0.3 Pa)
  Input power: 150 W
  Film-deposition speed: 6.8 nm/min
  Film composition: the content of Ta is 35 at %, the content of Hf is 15 at %, the content of O is 35 at % and the content of N is 15 at %

After the TaON film and the TaNH film are removed in the same manner as Example 3, the reflectivity of a surface of the Ru film and a surface of the second absorber layer (TaNH film, Ti film, TaHf film or TaHfON film) for EUV light are measured to confirm that the reflectivities of these absorber layers are substantially same as those of Example 3.

Example 5

Example 5 is carried out in the same manner as Example 3 except that the prepared mask blank is different from that of Example 3 in that the first absorber layer 4a is a TaHf film (film thickness 40 nm) and the low reflective layer is a TaHfON (film thickness 70 nm) and that the second absorber layer 6 is a Pt film (film thickness 40 nm), a CrN film (50 nm), a TaHf film (35 nm) or a TiN film (60 nm). The film-deposition conditions of the TaHf film are substantially same as those of Example 1, and the film-deposition conditions of the TaHfON film are substantially the same as those of Example 4. The film-deposition conditions of each film as the second absorber layer are as follows.
Film-Deposition Conditions of Pt Film (Magnetron Sputtering Method)
  Target: Ar target
  Sputtering gas: Ar (Ar: 100 vol %, gas pressure: 0.3 Pa)
  Input power: 400 W
  Film-deposition speed: 4.2 nm/min Film-Deposition Conditions of Crn Film: Substantially The Same As Example 2
Film-Deposition Conditions of Tahf Film: Substantially The Same As Example 1
Film-Deposition Conditions of Tin Film (Magnetron Sputtering Method)
  Target: Ti target
  Sputtering gas: Ar and $N_2$ (Ar: 75 vol %, $N_2$: 25 vol %, gas pressure: 0.4 Pa)
  Input power: 550 W
  Film-deposition speed: 3.9 nm/min
  Film composition: the content of Ti is 62 at %, and the content of N is 38 at %

The low reflective layer and the first absorber layer in the mask pattern region are removed by a dry etching process using $Cl_2$ diluted by He as an etching gas, and the reflectivity of a surface of the Ru film and a surface of the second absorber layer for EUV light are measured, to confirm that the reflectivities of these layers are substantially the same as those of Example 3.

Example 6

A Si/Mo multilayer reflective film and a Ru film (protection layer) are deposited in the same manner as Example 1. Next, a first absorber layer 4a (TaNH film) is deposited on the protection layer by using a magnetron sputtering method, to obtain a mask blank having a substrate 2 and a reflective layer 3, the protection layer and the first absorber layer 4a in this order present on the substrate 2.

The film-deposition conditions of the first absorber layer 4a are as follows. The first absorber layer 4a has a thickness expected to be required to use the principle of phase shift in relation to reflected light from the reflective layer 3. Specifically, the thickness is set to be 44 nm.
Film-Deposition Conditions of First Absorber Layer 4a (Tanh Film): Substantially The Same As Example 2

Next, on the first absorber layer 4a of the mask blank for first absorber layer evaluation obtained by the above process, a second absorber layer 6 (TaHf film) is deposited by using a magnetron sputtering method, to obtain an EUV mask blank 1 having a substrate 2 and a reflective layer 3, a protection layer, the first absorber layer 4a and the second absorber layer 6 present in this order on the substrate 2 is obtained.

The film-deposition conditions of the second absorber layer are as follows. Here, the second absorber layer 6 is deposited so that the total film thickness of the layer and the first absorber layer 4a becomes 78 nm so that the reflectivity for EUV light (13.5 nm) becomes at most 1%.
Film-Deposition Conditions of Second Absorber Layer 6 (Tahf Film): Substantially the same as Example 1
Evaluation of Reflectivity for EUV Light The reflectivity was measured in the same manner as Example 1. The results are as follows.
(Reflectivity of a Surface of First Absorber Layer 4a for Euv Light)
  5.2% with the thickness of 44 nm
(Reflectivity of a Surface of Second Absorber Layer 6 for Euv Light)
  0.4% when the total film thickness of the layer and the first absorber layer 4a is 78 nm The above reflectivity is less than 1%, which is a sufficiently low reflectivity for the layer to function as an EUV light-absorbing region provided outside a mask pattern region.

Further, in Example 6, the phase difference between EUV reflected light from the absorber layer 4 and EUV reflected light from the reflective layer 3 is about from 177 to 183°.

By constructing an EUV mask an Example of which is shown in FIG. 1 wherein such a first absorber layer 4a and a second absorber layer 5 are combined, it is possible to use the principle of phase shift in relation to reflected light from the low reflective layer in a mask pattern region. Accordingly, the reflectivity for EUV light from the outside of the mask pattern region is reduced and unnecessary exposure of a resist on the substrate due to reflected light from the outside of the mask pattern region is expected to be suppressed.

Example 7

A Si/Mo multilayer reflective film and a Ru film (protection layer) are deposited in the same manner as Example 1. Next, a first absorber layer 4a (TaBN film) is deposited on the protection layer by using a magnetron sputtering method, to obtain a mask blank having a substrate 2 and a reflective layer 3, the protection layer and the first absorber layer 4a present in this order on the substrate 2. The thickness of the TaBN film is 45 nm, and the TaBN film is deposited by a DC magnetron sputtering method using a target containing Ta and B and using Ar with 10% of nitrogen. The composition ratio of this TaBN film is that Ta is 60 at %, B is 10 at % and N is 30 at %. The crystal condition of the TaBN film is amorphous.

Next, an oxynitride film of tantalum boron alloy (TaBNO) is deposited on the first absorber layer to have a thickness of 15 nm as a low reflective layer. This TaBNO film is deposited by a DC magnetron sputtering method using a target containing Ta and B and using Ar with 10% of nitrogen and 20% of oxygen. The composition ratio of the TaBNO film for the low reflective layer deposited in this step is that Ta is 40 at %, B is 10 at %, N is 10 at % and O is 40 at %.

Next, on the low reflective layer, a TaBN film is deposited to have a thickness of 30 nm as a second absorber layer 6. The deposition process is substantially the same as that for depositing the first absorber layer 4a.

With respect to the mask blank obtained, the reflectivity of a surface of the first absorber layer 4a for EUV light and the reflectivity of a surface of the second absorber layer 6 for EUV light are measured. As a result, they are 5.3% and 0.3%, respectively, which indicates that these layers have sufficiently low reflectivities.

Industrial Applicability

In the EUV mask and EUV mask blank of the present invention, influence of reflected light from a region outside a mask pattern region is suppressed. Accordingly, the EUV mask and the EUV mask blank of the present invention achieve a transferred pattern excellent in the shape accuracy and dimension accuracy, and they can be widely used in semiconductor industries.

The entire disclosure of Japanese Patent Application No. 2008-182439 filed on Jul. 14, 2008 including specification, claims, drawings and summary is incorporated herein by reference in its entirety.

Explanation of Numerals
  1, 1', 1": EUV mask blank
  2: Substrate
  3: Reflective layer
  4, 4a, 4b: Absorber layer (first absorber layer)
  5: low reflective layer
  6: Second absorber layer
  10, 10', 10": EUV mask
  21: Mask pattern region
  22: EUV light-absorbing region 100: EUV mask
120: Substrate
130: Reflective layer
140: Absorber layer
200: Real exposure region
210: Mask pattern region
220: Region outside mask pattern region

What is claimed is:

1. A reflective mask for EUV lithography (EUVL), comprising:
   a substrate having a mask pattern region of the substrate and an EUV light-absorbing region located outside the mask pattern region of the substrate, the reflectivity of a surface of the EUV light-absorbing region for EUV light being at most 1%; and
   a reflective layer for reflecting EUV light provided on the mask pattern region of the substrate;
   the reflective mask having a portion in which an absorber layer is present on the reflective layer and a portion in which no absorber layer is present on the reflective layer, the reflectivity of a surface of the absorber layer for EUV light being from 5 to 15%;
   wherein the portion in which the absorber layer is present and the portion in which no absorber layer is present are arranged so as to form a mask pattern.

2. The reflective mask for EUVL according to claim 1, which further comprises a reflective layer for reflecting EUV light, a first absorber layer for absorbing EUV light and a second absorber layer for absorbing EUV light present in this order on the EUV light-absorbing region of the substrate, wherein the thickness of the absorber layer present on the mask pattern region is from 10 to 60 nm, the total thickness of the first and second absorber layers present on the EUV light-absorbing region is from 70 to 120 nm.

3. The reflective mask for EUVL according to claim 2, wherein the absorber layer and the first absorber layer each contains tantalum (Ta) as the main component and contains at least one component selected from the group consisting of hafnium (Hf), zirconium (Zr), germanium (Ge), silicon (Si), boron (B), nitrogen (N) and hydrogen (H); and
   the second absorber layer contains at least one component selected from the group consisting of tantalum (Ta), hafnium (Hf), germanium (Ge), silicon (Si), boron (B), titanium (Ti), chromium (Cr), platinum (Pt), gold (Au) and palladium (Pd).

4. The reflective mask for EUVL according to claim 1, which further comprises a reflective layer for reflecting EUV light and an absorber layer for absorbing EUV light present in this order on the EUV light-absorbing region of the substrate, wherein the thickness of the absorber layer present on the mask pattern region is from 10 to 60 nm, and the thickness of the absorber layer present on the EUV light-absorbing region is from 70 to 120 nm.

5. The reflective mask for EUVL according to claim 4, wherein the absorber layer contains tantalum (Ta) as the main component and contains at least one component selected from the group consisting of hafnium (Hf), germanium (Ge), zirconium (Zr), silicon (Si), boron (B), nitrogen (N) and hydrogen (H).

6. The reflective mask for EUVL according to claim 1, wherein the absorber layer is a layer whereby the phase of EUV reflected light from a surface of the absorber layer is different from the phase of EUV reflected light from the reflective layer by from 175 to 185°.

7. A process for producing a semiconductor integrated circuit, which comprises carrying out an exposure of an object to be exposed by using the reflective mask for EUVL as defined in claim 1, to produce a semiconductor integrated circuit.

8. A reflective mask for EUVL, comprising:
   a substrate having a mask pattern region of the substrate and an EUV light-absorbing region located outside the mask pattern region of the substrate, the reflectivity of a surface of the EUV light-absorbing region for EUV light being at most 1%; and
   a reflective layer for reflecting EUV light provided on the mask pattern region of the substrate;
   the reflective mask having a portion in which an absorber layer for absorbing EUV light and a low reflective layer for improving the contrast of inspecting the mask pattern are present in this order on the reflective layer, and a portion in which no absorber layer and no low reflective layer are present on the reflective layer, the reflectivity of a surface of the low reflective layer for EUV light being from 5 to 15%;
   wherein the portion in which the absorber layer and the low reflective layer are present and the portion in which no absorber layer and no low reflective layer are present are arranged so as to form a mask pattern.

9. The reflective mask for EUVL according to claim 8, which further comprises a reflective layer for reflecting EUV light, a first absorber layer for absorbing EUV light, a low reflective layer for improving the contrast at a time of inspecting the mask pattern and a second absorber layer for absorbing EUV light present in this order on the EUV light-absorbing region of the substrate, wherein the total thickness of the absorber layer and the low reflective layer present on the mask pattern region is from 10 to 65 nm, and the total thickness of the first and second absorber layers and the low reflective layer present in the EUV light-absorbing region is from 12 to 100 nm.

10. The reflective mask for EUVL according to claim 9, wherein the first absorber layer, the low reflective layer and the second absorber layer each contains tantalum (Ta) as the main component and contains nitrogen (N).

11. The reflective mask for EUVL according to claim 10, wherein the content of oxygen in each of the first absorber layer and the second absorber layer is at most 15 at %.

12. The reflective mask for EUVL according to claim 8, wherein the low reflective layer is a layer whereby the phase of EUV reflected light from a surface of the low reflective layer is different from the phase of EUV reflected light from the reflective layer by from 175 to 185°.

13. A process for producing a semiconductor integrated circuit, which comprises carrying out an exposure of an object to be exposed by using the reflective mask for EUVL as defined in claim 8, to produce a semiconductor integrated circuit.

14. A reflective mask blank for EUV lithography (EUVL) comprising a substrate, and a reflective layer for reflecting EUV light, a first absorber layer for absorbing EUV light and a second absorber layer for absorbing EUV light present in this order on the substrate,
   wherein the reflectivity of a surface of the first absorber layer for EUV light is from 5 to 15%, and the reflectivity of a surface of the second absorber layer for EUV light is at most 1%.

15. The reflective mask blank for EUVL according to claim 14, wherein the ratio of the etching rate of the first absorber layer to the etching rate of the second absorber layer (etching selectivity) is less than 0.1.

16. The reflective mask blank for EUVL according to claim 14, wherein the first absorber layer is a layer whereby the phase of EUV reflected light from the surface of the first absorber layer is different from the phase of EUV reflected light from the reflective layer by from 175 to 185°.

17. The reflective mask blank for EUVL according to claim 14, wherein the thickness of the first absorber layer is from 10 to 60 nm.

18. The reflective mask blank for EUVL according to claim 14, wherein the thickness of the second absorber layer is from 10 to 60 nm.

19. The reflective mask blank for EUVL according to claim 14, which further comprises a protection layer between the reflective layer and the first absorber layer, for protecting the reflective layer at a time of forming a mask pattern.

20. A process for producing a reflective mask for EUVL by employing the reflective mask blank for EUVL as defined in claim 14; the process comprising removing the second absorber layer present in a portion to be a mask pattern region in a reflective mask for EUVL be produced, to expose the first absorber layer to the outside, and forming a mask pattern in the first absorber layer exposed to the outside by the above step.

21. A process for producing a semiconductor integrated circuit, which comprises carrying out an exposure of an object to be exposed by using the reflective mask for EUVL produced by the process as defined in claim 20, to produce a semiconductor integrated circuit.

22. A reflective mask blank for EUV lithography (EUVL) comprising a substrate, and a reflective layer for reflecting EUV light, a first absorber layer for absorbing EUV light, a low reflective layer for improving the contrast at a time of inspecting the mask pattern, and a second absorber layer for absorbing EUV light present in this order on the substrate; wherein the reflectivity of a surface of the low reflective layer for EUV light is from 5 to 15%, and the reflectivity of a surface of the second absorber layer for EUV light is at most 1%.

23. The reflective mask blank for EUVL according to claim 22, wherein the ratio of the etching rate of the low reflective layer to the etching rate of the second absorber layer (etching selectivity) is less than 0.1.

24. The reflective mask blank for EUVL according to claim 22, wherein the low reflective layer is a layer whereby the phase of EUV reflected light from a surface of the low reflective layer is different from the phase of EUV reflected light from the reflective layer by from 175 to 185°.

25. The reflective mask blank for EUVL according to claim 22, wherein the first absorber layer, the low reflective layer and the second absorber layer each contains tantalum (Ta) as the main component and contains at least one component selected from the group consisting of hafnium (Hf), zirconium (Zr), germanium (Ge), silicon (Si), boron (B), nitrogen (N) and hydrogen (H).

26. The reflective mask blank for EUVL according to claim 22, wherein the low reflective layer contains tantalum (Ta) as the main component and contains at least one component selected from the group consisting of hafnium (Hf), germanium (Ge), silicon (Si), boron (B), nitrogen (N), hydrogen (H) and oxygen (O).

27. The reflective mask blank for EUVL according to claim 22, wherein the thickness of the low reflective layer is from 1 to 20 nm.

28. The reflective mask blank for EUVL according to claim 22, wherein the thickness of the first absorber layer is from 10 to 60 nm.

29. The reflective mask blank for EUVL according to claim 22, wherein the thickness of the second absorber layer is from 10 to 60 nm.

30. The reflective mask blank for EUVL according to claim 22, which further comprises a protection layer between the reflective layer and the first absorber layer, for protecting the reflective layer at a time of forming a mask pattern.

31. A process for producing a reflective mask for EUVL by employing the reflective mask blank for EUVL as defined in claim 22; the process comprising removing the second absorber layer present in a portion to be a mask pattern region in a reflective mask for EUVL to be produced, to expose the low reflective layer to the outside, and forming a mask pattern through both the low reflective layer exposed by the above step and the first absorber layer present under the low reflective layer.

32. A process for producing a semiconductor integrated circuit, which comprises carrying out an exposure of an object to be exposed by using the reflective mask for EUVL produced by the process as defined in claim 31, to produce a semiconductor integrated circuit.

33. A reflective mask blank for EUV lithography (EUVL) comprising a substrate, and a reflective layer for reflecting EUV light and a first absorber layer for absorbing EUV light laminated in this order on the substrate;
which further comprises a second absorber layer for absorbing EUV light that is provided on the first absorber layer present outside a portion to be used as a mask pattern region in a reflective mask for EUV lithography (EUVL) to be produced by the reflective mask blank for EUVL; wherein the reflectivity of a surface of the first absorber layer for EUV light is from 5 to 15%, and the reflectivity of a surface of the second absorber layer for EUV light is at most 1%.

34. The reflective mask blank for EUVL according to claim 33, wherein the first absorber layer is a layer whereby the phase of EUV reflected light from a surface of the first absorber layer is different from the phase of EUV reflected light from the reflective layer by from 175 to 185°.

35. The reflective mask blank for EUVL according to claim 33, which further comprises a low reflective layer present on the first absorber layer, for improving the contrast at a time of inspecting the mask pattern.

36. The reflective mask blank for EUVL according to claim 35, wherein the low reflective layer is a layer whereby the phase of EUV reflected light from a surface of the low reflective layer is different from the phase of EUV reflected light from the reflective layer by from 175 to 185°.

37. The reflective mask blank for EUVL according to claim 35, wherein the low reflective layer contains tantalum (Ta) as the main component and contains at least one component selected from the group consisting of hafnium (Hf), germanium (Ge), silicon (Si), boron (B), nitrogen (N), hydrogen (H) and oxygen (O).

38. The reflective mask blank for EUVL according to claim 35, wherein the thickness of the low reflective layer is from 1 to 20 nm.

39. The reflective mask blank for EUVL according to claim 33, wherein the first absorber layer contains tantalum (Ta) as the main component and contains at least one component selected from the group consisting of hafnium (Hf), zirconium (Zr), germanium (Ge), silicon (Si), boron (B), nitrogen (N) and hydrogen (H); and
the second absorber layer contains at least one component selected from the group consisting of tantalum (Ta), hafnium (Hf), germanium (Ge), silicon (Si), boron (B), titanium (Ti), chromium (Cr), platinum (Pt), gold (Au) and palladium (Pd).

40. The reflective mask blank for EUVL according to claim 39, wherein the low reflective layer contains tantalum (Ta) as the main component and contains at least one component selected from the group consisting of hafnium (Hf), germanium (Ge), silicon (Si), boron (B), nitrogen (N), hydrogen (H) and oxygen (O).

41. The reflective mask blank for EUVL according to claim 39, wherein the thickness of the low reflective layer is from 1 to 20 nm.

42. The reflective mask blank for EUVL according to claim 33, wherein the thickness of the first absorber layer is from 10 to 60 nm.

43. The reflective mask blank for EUVL according to claim 33, wherein the thickness of the second absorber layer is from 10 to 60 nm.

44. The reflective mask blank for EUVL according to claim 33, which further comprises a protection layer between the reflective layer and the first absorber layer, for protecting the reflective layer at a time of forming a mask pattern.

* * * * *